United States Patent
Takayama et al.

(10) Patent No.: US 7,147,740 B2
(45) Date of Patent: Dec. 12, 2006

(54) METHOD OF TRANSFERRING A LAMINATE AND METHOD OF MANUFACTURING A SEMICONDUCTOR DEVICE

(75) Inventors: Toru Takayama, Atsugi (JP); Yuugo Goto, Atsugi (JP); Junya Maruyama, Ebina (JP); Yumiko Ohno, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/438,854

(22) Filed: May 16, 2003

(65) Prior Publication Data

US 2003/0217805 A1  Nov. 27, 2003

(30) Foreign Application Priority Data

May 17, 2002  (JP) .............................. 2002-143797

(51) Int. Cl.
- *B44C 1/17* (2006.01)
- *H01L 21/02* (2006.01)
- *B29C 65/00* (2006.01)
- *H01B 13/00* (2006.01)
- *B44C 1/175* (2006.01)
- *H01B 13/008* (2006.01)
- *B32B 37/00* (2006.01)

(52) U.S. Cl. ...................... 156/235; 156/230; 156/249; 438/149; 438/450

(58) Field of Classification Search ................ 156/230, 156/233, 235, 239, 241, 247, 289, 344, 584; 216/13, 18, 20; 428/620, 914, 40.1, 195.1; 438/149, 450, 458, 441, 924, 972; 427/146, 427/147, 148, 96, 108, 117

See application file for complete search history.

(56) References Cited

U.S. PATENT DOCUMENTS

| | | | |
|---|---|---|---|
| 5,206,749 A | * | 4/1993 | Zavracky et al. ............. 349/45 |
| 5,391,257 A | | 2/1995 | Sullivan et al. |
| 5,834,327 A | | 11/1998 | Yamazaki et al. |

(Continued)

FOREIGN PATENT DOCUMENTS

EP    0 849 788    6/1998

(Continued)

OTHER PUBLICATIONS

Machine translation of JP 2002-217391 A obtained from http://www.ipdl.ncipi.go.jp/homepg_e.ipdl.*

(Continued)

*Primary Examiner*—Chris Fiorilla
*Assistant Examiner*—Sonya Mazumdar
(74) *Attorney, Agent, or Firm*—Eric J. Robinson; Robinson Intellectual Property Law Offices, P.C.

(57) ABSTRACT

An object of the present invention is to provide a method of transferring an object to be peeled onto a transferring member in a short time without imparting damage to the object to be peeled within a laminate. Also, another object of the present invention is to provide a method of manufacturing a semiconductor device in which a semiconductor element manufactured on a substrate is transferred onto a transferring member, typically, a plastic substrate. The methods are characterized by including: forming a peeling layer and an object to be peeled on a substrate; bonding the object to be peeled and a support through a two-sided tape; peeling the object to be peeled from the peeling layer by using a physical method, and then bonding the object to be peeled onto a transferring member; and peeling the support and the two-sided tape from the object to be peeled.

28 Claims, 15 Drawing Sheets

U.S. PATENT DOCUMENTS

| | | |
|---|---|---|
| 6,100,166 A | 8/2000 | Sakaguchi et al. |
| 6,127,199 A | 10/2000 | Inoue et al. |
| 6,372,608 B1 | 4/2002 | Shimoda et al. |
| 6,534,382 B1 | 3/2003 | Sakaguchi et al. |
| RE38,466 E | 3/2004 | Inoue et al. |
| 2002/0146893 A1 | 10/2002 | Shimoda et al. |
| 2003/0032210 A1 | 2/2003 | Takayama et al. |
| 2003/0082889 A1 | 5/2003 | Maruyama et al. |
| 2003/0203547 A1 | 10/2003 | Sakaguchi et al. |
| 2003/0224582 A1 | 12/2003 | Shimoda et al. |
| 2004/0219762 A1 | 11/2004 | Shimoda et al. |

FOREIGN PATENT DOCUMENTS

| | | | |
|---|---|---|---|
| EP | 0 858 110 | | 8/1998 |
| JP | 05-243519 | | 9/1993 |
| JP | 09-105896 | | 4/1997 |
| JP | 10-125929 | | 5/1998 |
| JP | 10-125931 | | 5/1998 |
| JP | 11-243209 | * | 9/1999 |
| JP | 11243209 A | * | 9/1999 |
| JP | 2001-125138 | | 5/2001 |
| JP | 2002-217391 | | 8/2002 |

OTHER PUBLICATIONS

Machine translation of JP 10-125929 A obtained from http://www.ipdl.ncipi.go.jp/homepg_e.ipdl.*

European Search Report dated Dec. 14, 2004 for EP 03 01 0502.

* cited by examiner

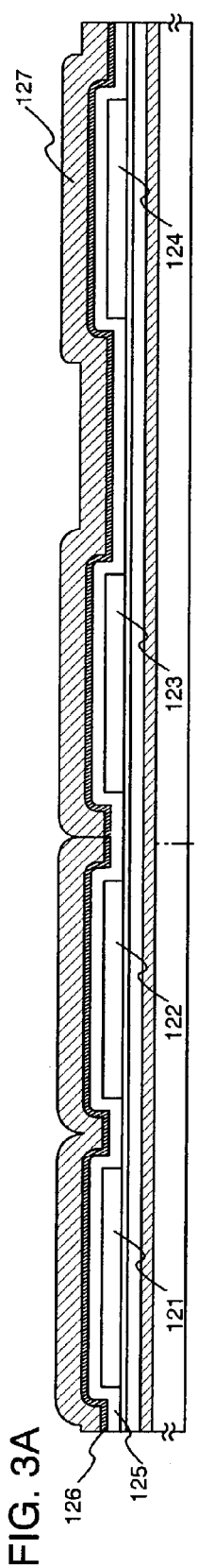
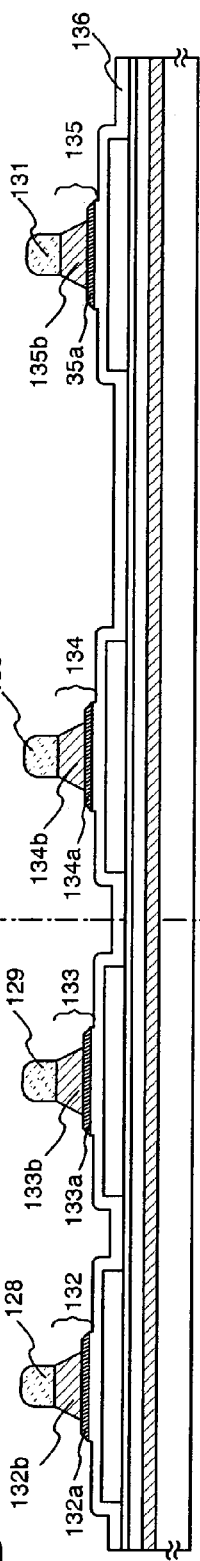
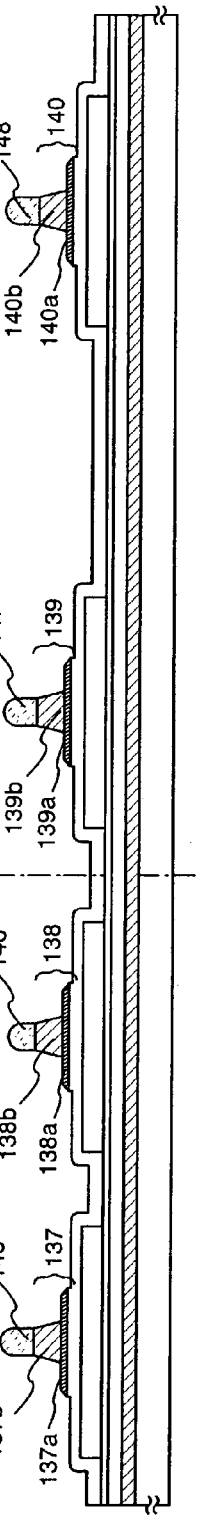
FIG. 3A
FIG. 3B
FIG. 3C
FIG. 3D

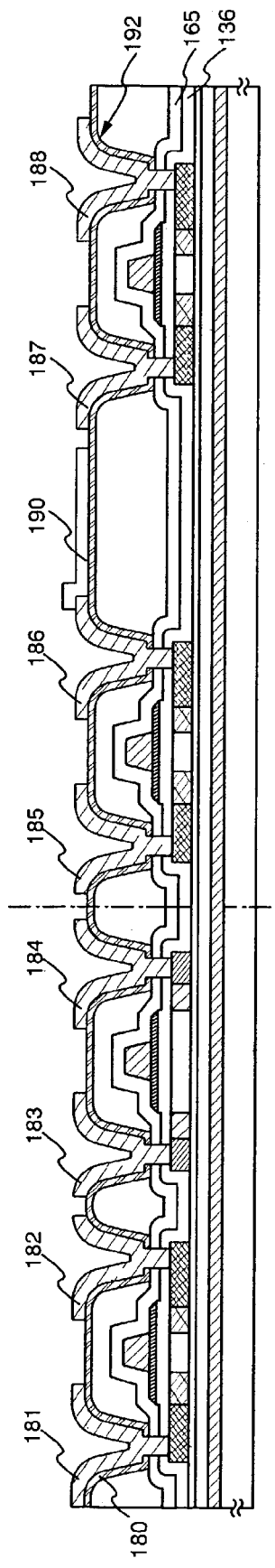
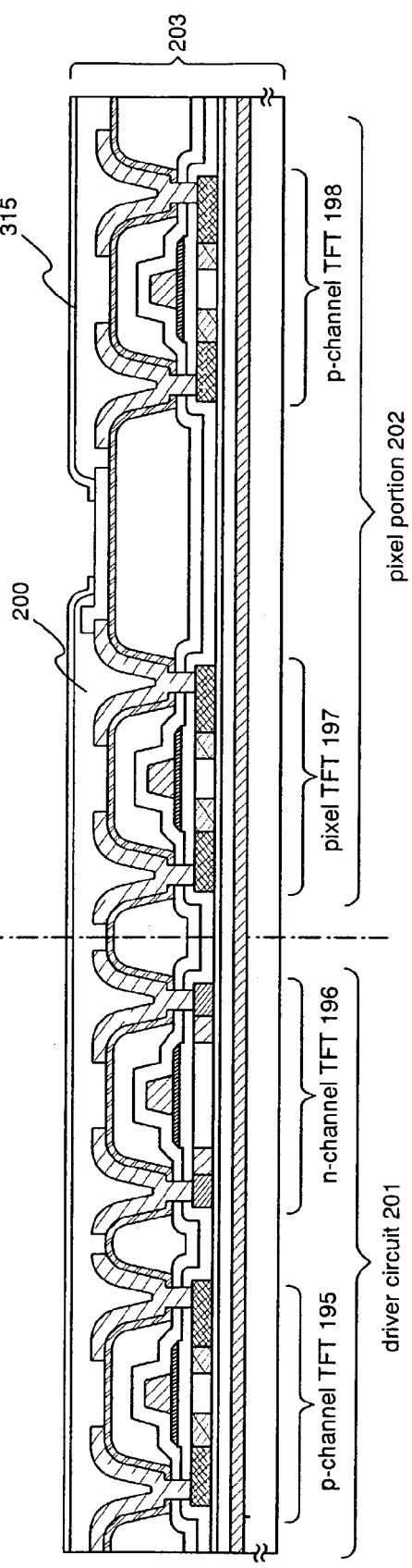
FIG. 5A
FIG. 5B

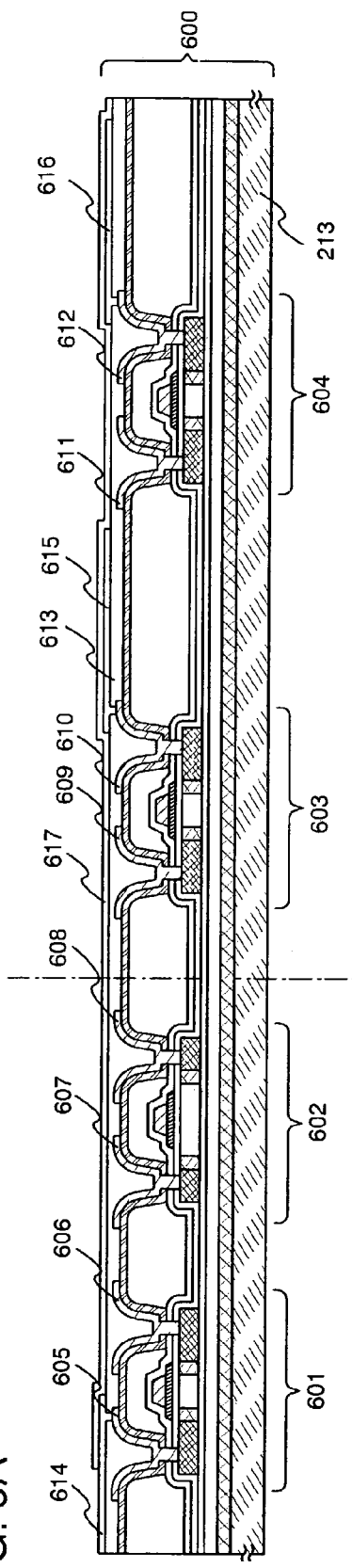
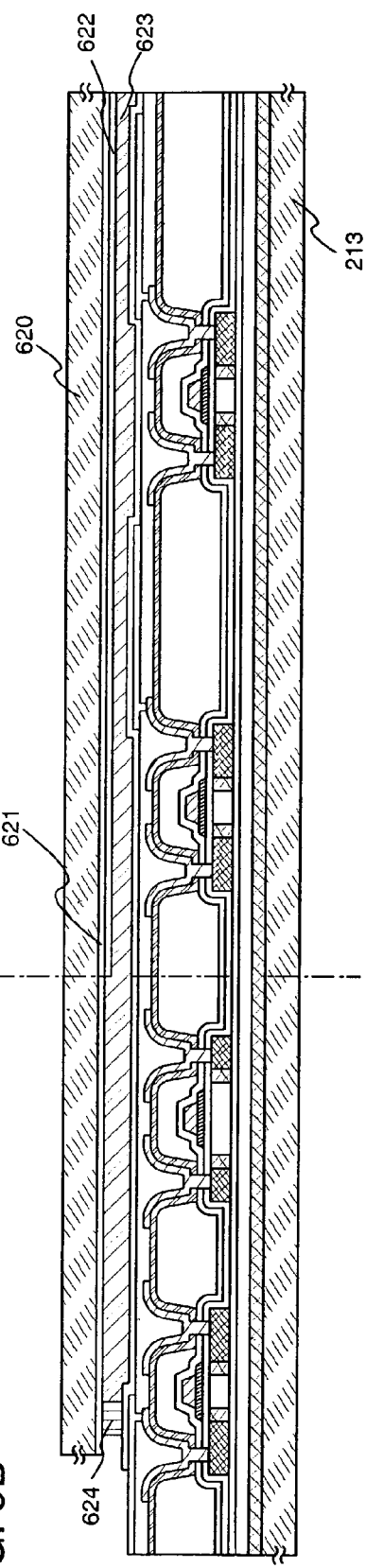
FIG. 9A
FIG. 9B

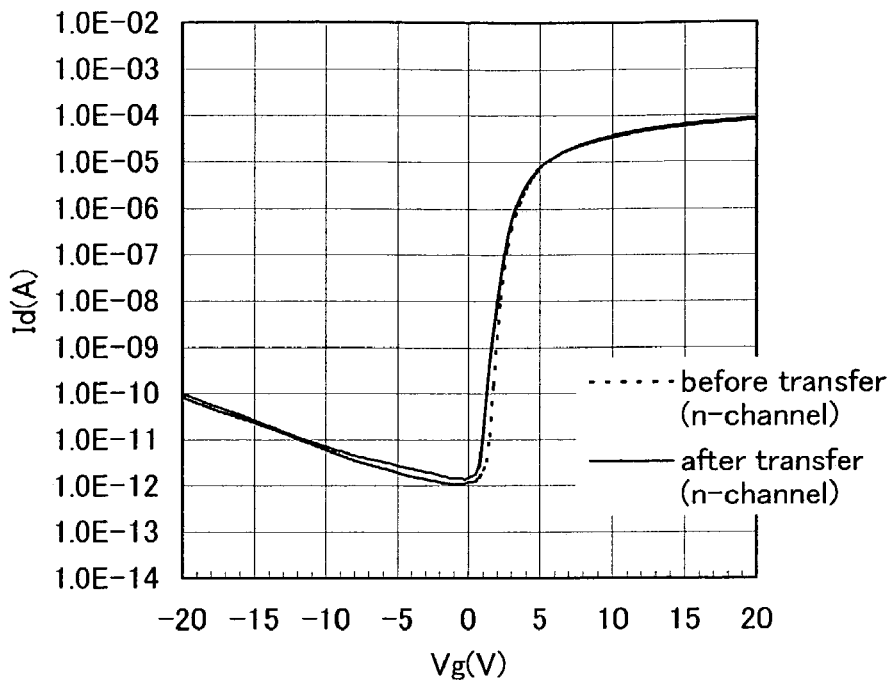
FIG. 14A Electrical characteristics of n-channel TFTs before and after transfer (Vds = 1V)
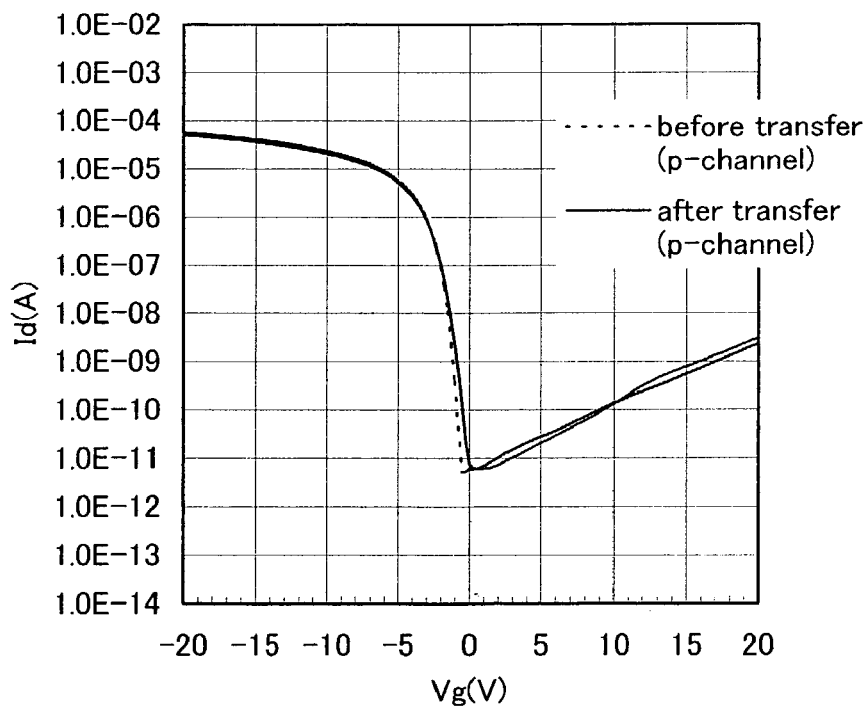
FIG. 14B Electrical characteristics of p-channel TFTs before and after transfer (Vds = 1V)

METHOD OF TRANSFERRING A LAMINATE AND METHOD OF MANUFACTURING A SEMICONDUCTOR DEVICE

BACKGROUND OF THE INVENTION

1. Field of the Invention

The present invention relates to a method of transferring a laminate. In addition, the present invention relates to a method of manufacturing a semiconductor device having a circuit structured by semiconductor elements, typically thin film transistors, in which an object to be peeled that contains the semiconductor elements is transferred to a substrate. For example, the present invention relates to an electro-optical device, typically a liquid crystal module, a light emitting device, typically an EL module, or an electronic device in which such a device is mounted as parts thereof.

2. Description of the Related Art

In recent years the focus has been on techniques of structuring thin film transistors by using semiconductor layers (having a thickness on the order of several nm to several hundreds of nm) formed on a substrate having an insulating surface. The thin film transistors are widely employed in electronic devices such as ICs and electro-optical devices, and in particular, the development of thin film transistors as switching elements of image display devices has been accelerating.

Many different kinds of applications that utilize this type of image display device have been anticipated, and the application to portable devices particularly has taken center stage. Devices that are lightweight, resistant to impact, and able to withstand some amount of deformation are expected. Glass and quartz are often used in thin film transistor substrates at present, and these substrates have disadvantages in that they are heavy and they easily break. Further, it is difficult to make large-size glass and quartz substrates, and therefore they are unsuited to thin film transistor substrates from the viewpoint of mass production. Trials have consequently been performed for forming thin film transistors on lightweight, durable plastic substrates, typically substrates having flexibility such as plastic films.

However, the present situation is that plastic has a low heat resistance, and therefore the maximum process temperature for forming the thin film transistors must be lowered. As a result, thin film transistors cannot be formed having electrical characteristics that are as good as those of thin film transistors formed on substrates having relatively high heat resistance, such as glass substrates, and quartz substrates.

On the other hand, peeling methods for peeling an object to be peeled, which exists on a substrate through a separation layer, from the substrate have already been proposed. For example, the techniques discussed in JP 10-125929 A (pages 4 to 10) and JP 10-125931 A (pages 6 to 10) are ones in which a separation layer made from amorphous silicon (or crystalline silicon) is formed, and air gaps are made to develop within the amorphous silicon (or the crystalline silicon) by passing laser light through a substrate and emitting hydrogen contained in the amorphous silicon. The substrate is then peeled from the object to be peeled.

In addition, processes similar to the techniques of JP 10-125929 A and JP 10-125931 A are reported in JP 2002-217391 A (pages 3 to 6, FIG. 9) for: forming a separation layer made from amorphous silicon (or crystalline silicon); forming a second substrate (temporary transferring member) on a surface of an object to be peeled (stated as layer to be peeled in the official gazette, typically indicating a thin film transistor) by using a water-soluble temporary adhesive layer; irradiating laser light to a separation interlayer insulating film through the substrate; peeling a first substrate (glass substrate) from the objet to be peeled, and transferring the object to be peeled onto a third substrate (film); immersing the third substrate within water, and dissolving the water-soluble temporary adhesive layer; and peeling the object to be peeled from the second substrate, thus exposing the surface of the object to be peeled.

However, it is essential to use a substrate having good light transmitting characteristics with the methods disclosed in JP 10-125929 A and JP 10-125931 A, and therefore there is a problem in that the substrates capable of being used are limited. Further, a relatively high-power laser light irradiation is necessary in order to impart an energy sufficient to pass through the substrate and cause hydrogen contained in the amorphous silicon to be emitted, and therefore there is a problem in that the laser light may damage the object to be peeled.

Further, if high-temperature heat treatment is performed in an element manufacturing process when manufacturing elements on the separation layer by the aforementioned methods, hydrogen contained in the separation layer diffuses and is reduced, and there is a concern that peeling cannot be sufficiently performed even if laser light is irradiated to the separation layer.

In addition, the transferring member is fixed to the surface of the object to be peeled using a curing adhesive, and therefore the surface of the object to be peeled, for example, the surface of the thin film transistor, specifically wirings or pixel electrodes are not exposed when peeling the substrate from the object to be peeled, and therefore it is difficult to measure the characteristics of the object to be peeled after peeling off the substrate. For cases of manufacturing a liquid crystal display device or a light emitting device using an object to be peeled with this type of structure, the structure becomes one in which a plurality of substrates are bonded to one another, and the thickness of the liquid crystal display device or the light emitting device becomes larger, and there is a problem in that electronic devices cannot be made smaller when using the liquid crystal display device or the light emitting device. Further, there is a problem in that projection light from a backlight in a liquid crystal display device, and light emitted from light emitting elements in a light emitting device each cannot be effectively taken out.

The object to be peeled and the second substrate are bonded by a water soluble adhesive in the invention disclosed in JP 2002-217391 A, but the surface area of the water soluble adhesive that is exposed to water is small in actuality, and therefore there is a problem in that peeling of the second substrate takes time.

In addressing this problem, it is possible to shorten the peeling time by removing a portion of the second substrate and exposing a much larger surface area of the temporary adhesive layer. The second substrate is disposable in this case, but there is a problem in that costs will increase when using expensive materials such as quartz glass, or rare materials in the second substrate.

In addition, if an organic resin is used in an interlayer insulating film of the thin film transistor, which is the object to be peeled, there is a problem in that the volume of the interlayer insulating film expands and the film deforms because organic resins tend to absorb moisture, and thin film transistor wirings will peel off.

SUMMARY OF THE INVENTION

The present invention has been made in view of the above-mentioned problems, and an object of the present invention is to provide a method of bonding onto a transferring member an object to be peeled, which is peeled from a substrate in a short time without damage being imparted to the object to be peeled within a laminate.

According to the present invention, there is provided a method of transferring a laminate including: forming a peeling layer and an object to be peeled on a substrate; bonding the object to be peeled and a support through a peelable adhesive medium; peeling the object to be peeled from the peeling layer by using physical means, and then bonding the object to be peeled onto a transferring member; and peeling the support and a two-sided tape from the object to be peeled.

Further, according to the present invention, there is provided a method of transferring a laminate including: forming a peeling layer and an object to be peeled on a substrate; bonding the object to be peeled and a support through a peelable adhesive medium; peeling the object to be peeled from the peeling layer by using physical means, and then bonding one side of the object to be peeled onto a first transferring member; peeling the support and the peelable adhesive medium from the object to be peeled; and bonding the other side of the object to be peeled to a second transferring member.

Further, according to the present invention, there is provided a method of manufacturing a semiconductor device including: forming a peeling layer and an object to be peeled including a semiconductor element on a substrate; bonding the object to be peeled and a support through a peelable adhesive medium; peeling the object to be peeled from the peeling layer by physical means, and then bonding the object to be peeled onto a transferring member; and peeling the support and the peelable adhesive medium from the object to be peeled.

Further, according to the present invention, there is provided a method of manufacturing a semiconductor device including: forming a peeling layer and an object to be peeled on a substrate; bonding the object to be peeled and a support, through a peelable adhesive medium; peeling the object to be peeled from the peeling layer by physical means, and then bonding one side of the object to be peeled onto a first transferring member; peeling the support and the peelable adhesive medium from the object to be peeled; and bonding a second transferring member to the other side of the object to be peeled.

Further, a semiconductor element is a thin film transistor, an organic thin film transistor, an organic thin film transistor, a thin film diode, a photoelectric conversion element, or a resistive element. A photoelectric conversion element made through a silicon PIN junction can be given as a typical example of the photoelectric conversion element.

Further, the object to be peeled has an oxide layer contacting the peeling layer, typically, a single layer made of a silicon oxide or a metallic oxide, or a laminate structure thereof.

Further, the peeling layer is a metallic film or a nitride film. The metallic film or the nitride film includes a single layer including an element selected from the group consisting of titanium, aluminum, tantalum, tungsten, molybdenum, copper, chromium, neodymium, iron, nickel, cobalt, ruthenium, rhodium, palladium, osmium, and iridium, an alloy material mainly containing the elements, or a nitride compound of the elements, or a laminate structure thereof.

Further, an adhesive of the peelable adhesive medium is an adhesive capable of being peeled by heat (hereinafter indicated as heat-peeling adhesive) and/or an adhesive capable of being peeled by ultraviolet light irradiation (hereinafter indicated as ultraviolet-peeling adhesive).

Further, plastic can be given as a typical example of the first transferring member, typically plastic having flexibility like plastic film. Furthermore, materials having a poor waterproof property (such as paper, cloth, woods, and metals applied to the transferring member) can be used in the first transferring member. Further, materials having thermal conductivity can also be used.

Further, plastic, typically plastic having flexibility like plastic film, can be given as a typical example of the second transferring member. Furthermore, materials having a poor waterproof property (such as paper, cloth, woods, and metals applied to the transferring member) can be used in the first transferring member. Further, materials having thermal conductivity can also be used.

Further, typical examples of the physical means include means that use human hand and wind pressure of a gas sprayed from a nozzle, and means of peeling off by a relatively small force such as ultrasound.

Note that a tape-shaped material in which an adhesive is formed on both sides of a substrate (two-sided tape), a similar sheet-shaped material (two-sided sheet), a similar film-shaped material (two-sided film) and the like can be given as the peelable adhesive medium. Although the present invention will be explained below using two-sided tape as a typical example of the peelable adhesive medium in embodiment modes and embodiments, two-sided sheets and two-sided films may also be applied thereto.

BRIEF DESCRIPTION OF THE DRAWINGS

In the accompanying drawings:

FIGS. 3A to 3D are cross sectional diagrams showing the process of manufacturing the active matrix substrate in accordance with Embodiment 1 of the present invention;

FIGS. 5A and 5B are cross sectional diagrams showing the process of manufacturing the active matrix substrate in accordance with Embodiment 1 of the present invention;

FIGS. 9A and 9B are cross sectional diagrams showing a process of manufacturing a liquid crystal module in accordance with Embodiment 4 of the present invention;

FIGS. 14A and 14B are graphs showing electrical characteristics of TFTs manufactured in accordance with Embodiment 1 of the present invention.

DETAILED DESCRIPTION OF THE PREFERRED EMBODIMENTS

Embodiment Modes

Embodiment modes of the present invention are explained below.

[Embodiment Mode 1]

Procedures of a typical transferring method using the present invention are explained briefly using FIGS. 1A to 1E.

Figure 1A:
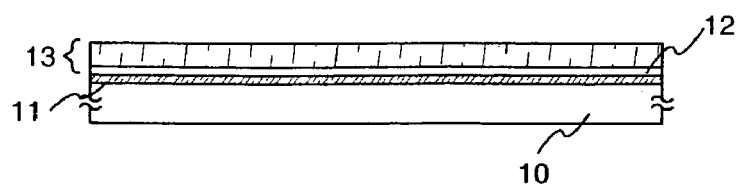
FIGS. 1A to 1E are diagrams showing the concept of Embodiment Mode 1 of the present invention.

First, a description will be made with reference to FIG. 1A. Reference numeral 10 denotes a substrate, reference numeral 11 denotes a peeling layer, reference numeral 12 denotes an oxide layer, reference numeral 13 denotes an object to be peeled, and includes the oxide layer 12.

Glass substrates, quartz substrates, ceramic substrates, and the like can be used as the substrate 10. Further, silicon substrates, metallic substrates, and stainless steel substrates may also be used.

A peeling layer 11, which is a nitride layer or a metallic layer, is formed on the substrate 10. A typical example of the metallic layer includes a single layer made of an element selected from the group consisting of titanium (Ti), aluminum (Al), tantalum (Ta), tungsten (W), molybdenum (Mo), copper (Cu), chromium (Cr), neodymium (Ne), iron (Fe), nickel (Ni), cobalt (Co), ruthenium (Ru), rhodium (Rh), palladium (Pd), osmium (Os), and iridium (Ir), or an alloy mainly containing the above elements, or a laminate structure thereof. A typical example of the nitride layer is a single layer made from a nitride of the above metal elements, for example, titanium nitride, tungsten nitride, tantalum nitride, or molybdenum nitride, or a laminate structure thereof.

The object to be peeled 13 that contains the oxide layer 12 is formed next on the peeling layer 11, which is a nitride layer or a metallic layer. An oxide layer that uses silicon oxide, silicon oxynitride, or a metal oxide may be formed as the oxide layer 12. Note that the oxide layer 12 may be formed by using any film formation method, such as sputtering, plasma CVD, coating, and the like.

Semiconductor elements (such as thin film transistors, organic thin film transistors, thin film diode photoelectric conversion elements, resistive elements, and the like) may also be included in the object to be peeled 13.

Figure 1B:
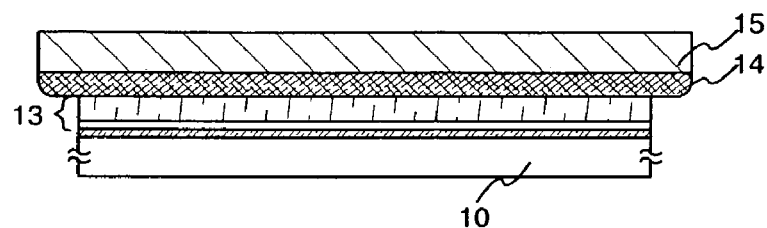

Next, a description will be made with reference to FIG. 1B. One surface of a two-sided tape 14 is bonded onto the object to be peeled 13. Two-sided tape applied with an ultraviolet-peeling adhesive or a heat-peeling adhesive is used. Cracks are easily generated in the object to be peeled 13 during a later peeling process if air bubbles enter between the object to be peeled 13 and the two-sided tape 14 at this point, and therefore bonding is performed so that air bubbles do not enter between the object to be peeled 13 and the two-sided tape 14. Note that, by using a tape mounting apparatus or the like in this process, bonding can be performed in a short time so that air bubbles do not enter between the object to be peeled 13 and the two-sided tape 14.

The other side of the two-sided tape 14 is bonded to a support 15. The support 15 may be a quartz glass, a metal, a ceramic, or the like, for example. It is necessary to fix the support 15 securely to the two-sided tape 14 at this point. This is for preventing the support 15 and the two-sided tape 14 from peeling off first when peeling the object to be peeled 13 from the substrate 10. Note that the two-sided tape can be bonded to the support in a short time by using a press machine or the like in this process.

Figure 1C:
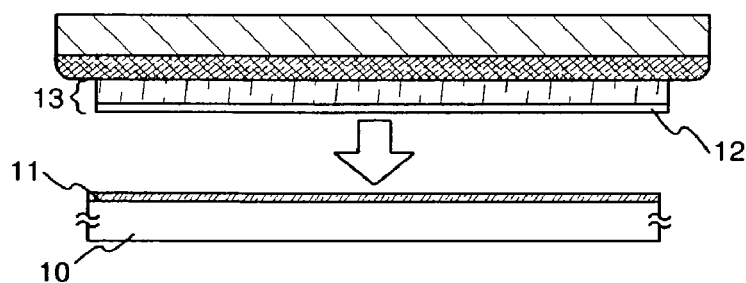

Next, a description will be made with reference to FIG. 1C. The peeling layer 11 is peeled from the object to be peeled 13 by applying a physical force to peeling layer 11, which is made from a nitride layer or a metallic layer, and the oxide layer 12. An example is shown here in which the mechanical strength of the substrate is sufficient. If the adhesion between the peeling layer 11 and the oxide layer 12 is high, and the mechanical strength of the substrate 10 is low, then there is a danger that the substrate 10 will crack during peeling. It is therefore possible to perform more effective peeling if peeling is performed after a support (not shown in the figures), for example plastic, glass, metal, ceramic, or the like, is mounted to a rear surface of the substrate (the surface on which the peeling layer is not formed).

Note that the physical force is a relatively small force such as a manual force by a human hand, velocity pressure of a gas sprayed from a nozzle, and ultrasound.

Figure 1D:
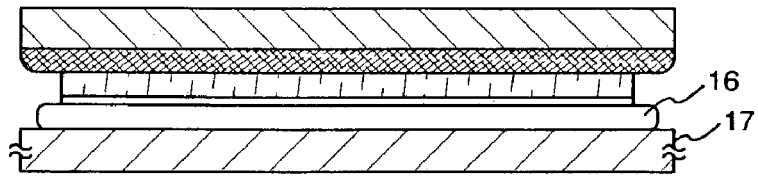

Next, a description will be made with reference to FIG. 1D. The object to be peeled 13 is bonded to a transferring member 17 by using an adhesive 16. Note that it is possible for the adhesive 16 to use an adhesive capable of being peeled off by a reaction (hereinafter indicated as a reaction setting adhesive), an adhesive capable of being peeled off by heat (hereinafter indicated as a thermosetting adhesive), or adhesive capable of being peeled off by light, such as an ultraviolet setting adhesive (hereinafter indicated as a photosetting adhesive. Epoxy resin, acrylic resin, silicon resin, and the like can be given as typical examples of these.

Figure 1E:
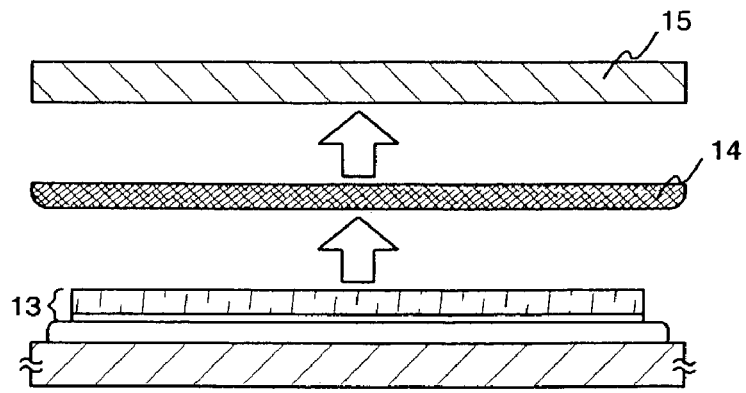

Next, a description will be made with reference to FIG. 1E. The object to be peeled 13 and the two-sided tape 14 are peeled apart. If ultraviolet peeling two-sided tape is used for the two-sided tape 14, peeling can be performed by irradiating ultraviolet light for a short period of time, specifically for 50 to 100 seconds. Further, peeling can be performed by heating the substrate if heat peeling two-sided tape is used for the two-sided tape 14. The heating temperature in this case is set within a range from 90 to 150° C., preferably from 110 to 120° C., and the amount of heating time is as short as two to three minutes. The support 15 and the two-sided tape 14 are peeled apart first, and then the object to be peeled 13 and the two-sided tape 14 are peeled apart.

The object to be peeled can be transferred onto the transferring member by the above steps. Note that a separation substrate may also be mounted on the exposed object to be peeled.

Note that the term transferring member as used in this specification denotes an object to which the object to be peeled is bonded after the substrate is peeled from the object to be peeled. There are no limitations placed on the materials used in the transferring member, and any material such as plastics, glasses, metals, ceramics, and the like may be used. Similarly, the term support as used in this specification denotes an object to which the object to be peeled is bonded when peeling the substrate by the physical means. There are no limitations placed on the materials used in the support, and any material such as plastics, glasses, metals, ceramics, and the like may be used. Further, there are no limitations placed on the shapes of the transferring member or the support, and they may have a flat surface, a curved surface, flexibility, and a film shape. Furthermore, if light weight is given the highest priority, it is preferable to use a film shape plastic, for example, polyethylene terephthalate (PET), polyethylene sulfide (PES), polyethylene naphthalate (PEN), polycarbonate (PC), nylon, polyether ether ketone (PEEK), polysulfone (PSF), polyether imide (PEI), polyacrylate (PAR), polybutylene terephthalate (PBT), ARTON (manufactured by JSR Corporation) which is made from norbornene resin having a polar group, or the like. A film having thermal conductivity, such as aluminum nitride, or aluminum oxynitride, may also be formed on a surface of these plastics. Further, iron, copper, aluminum, aluminum nitride, magnesium oxide, or the like may also be dispersed within these plastics. It is possible for the transferring member to absorb heat generated due to driving if these types of plastics are used in the transferring member for cases in which a semiconductor circuit that performs high speed operation, such as a CPU, or a memory is formed on the object to be peeled.

Further, there is no dipping process in the present invention, and therefore materials that have a poor waterproof property (such as paper, cloth, woods, and metals applied to the transferring member) can also be used in the transferring member. Further, resins having thermal conductivity can also be used. In addition, it is also possible to use a semiconductor device (such as a logic circuit, a memory, a driver circuit, a power source circuit, or a switch), on which semiconductor elements are formed, as the transferring member, and to transfer a separate semiconductor device onto the transferring member. The characteristics of each of the semiconductor devices can be investigated in this case, and only those having superior characteristics (devices that are not defective) can be laminated. The overall yield can therefore be effectively increased.

[Embodiment Mode 2]

The structure of a peelable adhesive medium (two-sided tape is employed as a typical example) used in a transferring process of the present invention is explained here.

Figure 11A:
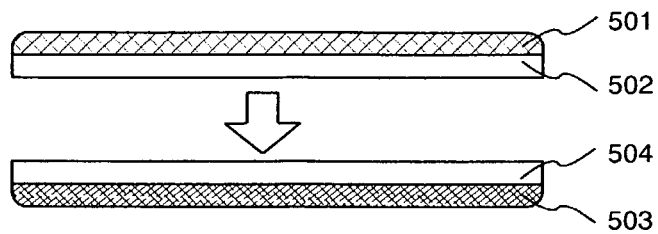
FIGS. 11A to 11F are diagrams showing the concept of Embodiment Mode 2 of the present invention.
Figure 11B:
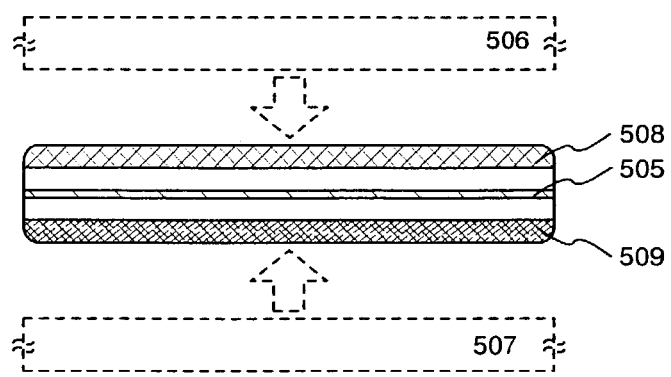

FIG. 11A and FIG. 11B are explained. The two-sided tape used in the present invention is one in which a first substrate 502 having a first adhesive 501, and a second substrate 504 having a second adhesive 503, are joined together by a cured adhesive 505. Heat-peeling adhesives and/or ultraviolet-peeling adhesives can be used in the first adhesive and in the second adhesive. Further, adhesives that are peelable by the irradiation of light (visible light, infrared light, and the like) (light peeling adhesives), and adhesives that are peelable by a chemical reaction (reaction peeling adhesives) can also be used as substitutes for the ultraviolet-peeling adhesives and the heat-peeling adhesives.

A heat-peeling adhesive and an ultraviolet-peeling adhesive are used as typical examples of adhesives in this embodiment mode. Note that it is also possible to use other adhesives.

Note that the first adhesive 508 indicates an adhesive bonded to a support 506, and the second adhesive 509 indicates an adhesive bonded to an object to be peeled 507 in this embodiment mode.

Figure 11C:
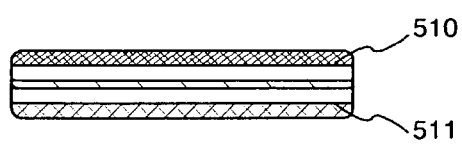

An example of using a heat-peeling adhesive in a first adhesive 508, and using an ultraviolet-peeling adhesive in a second adhesive 509 is shown in FIG. 11B, but there are no limitations placed on this combination. An ultraviolet-peeling adhesive can also be used in a first adhesive 510, and a heat-peeling adhesive can also be used in a second adhesive 511, as in FIG. 11C.

Figure 11D:
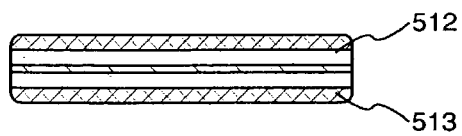
Figure 11E:
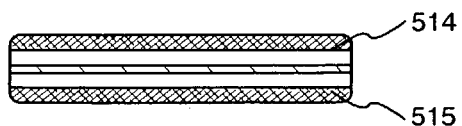

In addition, in the first adhesive and the second adhesive, they may also be used adhesives of the same adhesive type. An example of using heat-peeling adhesives in a first adhesive 512 and in a second adhesive 513 is shown in FIG. 11D, and two-sided tape that uses ultraviolet-peeling adhesives in a first adhesive 514 and in a second adhesive 515 is shown in FIG. 11E.

Figure 11F:
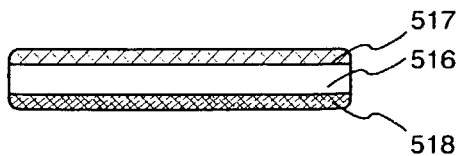

On the other hand, although two-sided tapes in which the first substrate 502 and the second substrate 504 are bonded are shown in FIGS. 11A to 11E, both sides of a first substrate 516 may also have a heat-peeling adhesive 517 and/or an ultraviolet-peeling adhesive 518, as in FIG. 11F.

Note that, although peelable adhesive mediums having adhesives on both sides of one or more substrates are shown in this embodiment mode, the peelable adhesive medium is not limited to these. An adhesive medium of only a peelable adhesive can also be applied to the present invention.

Embodiments

[Embodiment 1]

An embodiment of the present invention is explained using FIGS. 2A to 6B. A method of transferring a laminate having a thin film transistor to an object to be peeled is explained here. First, a method of manufacturing a pixel portion on the same substrate simultaneously with TFTs of driver circuits formed in the periphery of the pixel portion is explained first.

Figure 2A:
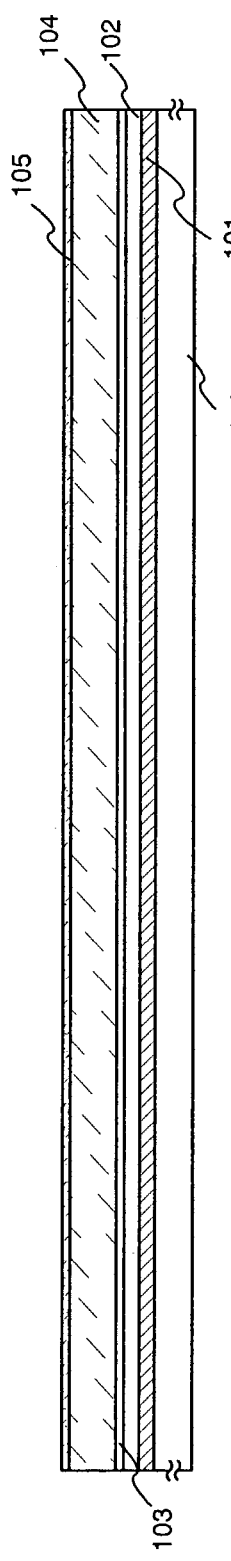
FIGS. 2A to 2D are cross sectional diagrams showing a process of manufacturing an active matrix substrate in accordance with Embodiment 1 of the present invention.

A description will be made with reference to FIG. 2A. A peeling layer 101, which is a nitride film or a metallic film, an oxide layer 102, a silicon oxide film 103, which is a base film, and an amorphous silicon film 104 are formed on a substrate 100, and a solution 105 containing nickel is applied on the top.

A glass substrate is used as the substrate 100 in this embodiment, but the substrate 100 is not limited to glass, and quartz substrates, semiconductor substrates, metallic substrates, ceramic substrates, and the like can also be used.

Further, if a metallic film is used in the peeling layer 101, a single layer made from an element selected from the group consisting of titanium (Ti), aluminum (Al), tantalum (Ta), tungsten (W), molybdenum (Mo), copper (Cu), chromium (Cr), neodymium (Ne), iron (Fe), nickel (Ni), cobalt (Co), ruthenium (Ru), rhodium (Rh), palladium (Pd), osmium (Os), and iridium (Ir), or an alloy or chemical compound mainly containing the above elements, or a laminate thereof may be used in the peeling layer 101. On the other hand, if a nitride film is used in the peeling layer 101, then a single layer made from titanium nitride, tungsten nitride, tantalum nitride, or molybdenum nitride, or a laminate thereof, may be used. A 50 nm thick tungsten film formed by sputtering is used here.

Further, a single layer made from a silicon oxide or a metal oxide having a thickness form 10 to 600 nm, preferably from 150 to 200 nm, or a laminate structure of these single layers, may be used as the oxide layer 102. A silicon oxide layer having a film thickness of 200 nm and formed by sputtering is used here. The bonding force between the metallic layer 101 and the oxide layer 102 is strong with respect to heat treatment, film peeling and the like are not caused, and peeling can be performed simply by physical means within the oxide layer, at an interface between the oxide layer and the metallic layer, or at an interface between the oxide layer and the nitride layer.

Further, a silicon oxynitride film (composition ratios: Si=32%, O=27%, N=24%, H=17%) having a film thickness of 10 to 200 nm (preferably 50 nm) and formed by plasma CVD with film formation conditions in which a deposition temperature is 400° C., and material gas flow rates for $SiH_4$ and $N_2O$ are 4 sccm and 800 sccm, respectively, is used as the base insulating layer 103.

The amorphous silicon film 104 is formed next having a film thickness of 25 to 80 nm, 54 nm in this embodiment, by using plasma CVD with a film formation temperature of 300° C. and using $SiH_4$ as a film formation gas. Note that there are no limitations placed on the semiconductor film material, and the amorphous silicon film 104 may be formed by a known means (such as sputtering, LPCVD, plasma CVD, or the like) using silicon, a silicon germanium alloy ($Si_XGe_{1-X}$, where X=0.0001 to 0.02), or the like.

Further, the concentration of the nickel solution 105 may be suitably regulated. A nickel acetate salt solution containing nickel at 10 ppm by weight is used in this embodiment, and applied onto the amorphous semiconductor film by using a spinner. A method of adding nickel elements to the entire surface of the amorphous silicon film by sputtering may also be used as a substitute for application.

Figure 2B:
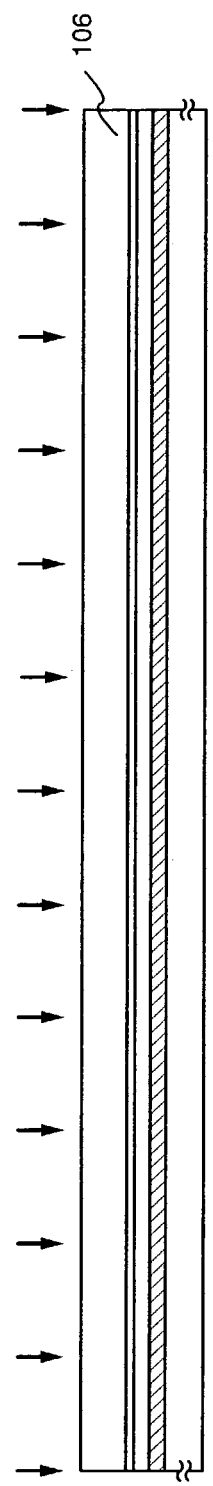

Next, a description will be made with reference to FIG. 2B. The amorphous semiconductor film is crystallized by performing heat treatment. In the heat treatment, there may be used electric furnace heat treatment or irradiation of strong light. If heat treatment is performed within an electric furnace, it may be performed at a temperature of 500 to 650° C. for 4 to 24 hours. Heat treatment (heating at 550° C. for 4 hours) for crystallization is performed here after heat treatment (heating at 500° C. for 1 hour) for dehydrogenation, and a crystalline silicon 106 film is obtained. Note that, although crystallization of the amorphous semiconductor film is performed by heat treatment using a furnace here, crystallization may also be performed by a lamp annealing apparatus. Note also that, although a crystallization technique that employs nickel as a metallic element for promoting the crystallization of silicon is used here, another known crystallization technique may also be used, for example, solid state growth or laser crystallization.

A first laser light (XeCl, wavelength 308 nm) is irradiated next in the air, or within an oxygen atmosphere, in order to repair defects remaining within crystal grains and improve crystallinity after removing an oxide film on a surface of the crystalline semiconductor film by using hydrofluoric acid or the like. Excimer laser light having a wavelength equal to or less than 400 nm, and the second harmonic or the third harmonic of a YAG laser are used as the laser light. Whichever laser light is employed, pulse laser light having a repetition frequency on the order of 10 to 1000 Hz is used. The laser light is condensed by an optical system to 100 to 500 mJ/cm$^2$, and then scanned over the silicon film surface while being irradiated with an overlap ratio of 90 to 95%. The first laser light is irradiated in the air at a repetition frequency of 30 Hz and an energy density of 393 mJ/cm$^2$ here. Note that an oxide film is formed on the surface by the first laser light irradiation because it is performed in the air or within an oxygen atmosphere. The oxide film is then removed by using diluted hydrofluoric acid, and an extremely thin oxide film is then formed on the surface by using aqueous ozone.

Doping of a minute amount of impurities (boron or phosphorus) is performed next in order to control thin film transistor threshold values (not shown in the figures). Ion doping in which diborane ($B_2H_6$) is excited by a plasma without separation of mass is used here. The doping conditions are as follows: diborane diluted to 1% by hydrogen is introduced within a chamber at a flow rate of 30 sccm, and an acceleration voltage of 15 kV is applied. Boron is thus added to the amorphous semiconductor film on the order of a dosage of $1\times10^{13}$/cm$^2$.

Figure 2C:
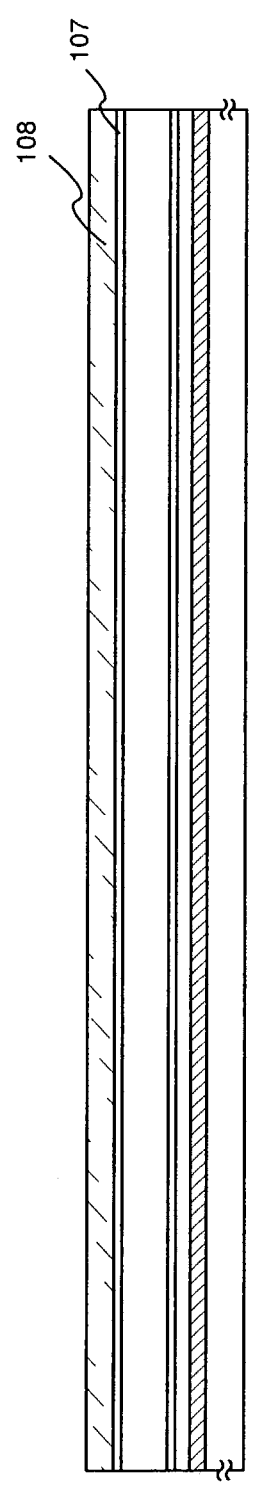

Next, a description will be made with reference to FIG. 2C. The surface of the amorphous semiconductor film is then processed for 120 seconds by aqueous ozone, forming a barrier layer 107 made from a 1 to 5 nm thick oxide film.

An amorphous silicon film 108 containing argon element, which becomes a gettering site, is formed next on the barrier layer 107 by sputtering to have a thickness of 50 nm. The film formation conditions may be suitably regulated, and sputtering is used in this embodiment. The film formation pressure is set to 0.3 Pa, the flow rate of argon gas is set to 50 sccm, the film formation electric power is set to 3 kW, and the film formation temperature is set to 150° C. Note that the atomic concentration of argon elements contained in the amorphous silicon film is from $3\times10^{20}$/cm$^3$ to $6\times10^{20}$/cm$^3$, and the atomic concentration of oxygen is from $1\times10^{19}$/cm$^3$ to $3\times10^{19}$/cm$^3$ at the above conditions. Heat treatment is then performed for 4 hours at a temperature of 550° C. within an electric furnace, thus performing metallic element gettering.

Figure 2D:
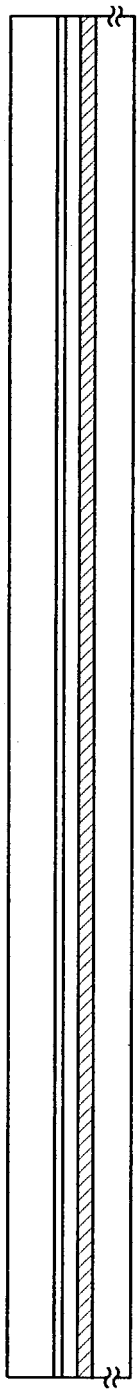

Next, a description will be made with reference to FIG. 2D. The amorphous silicon film 108 containing argon element, as the gettering sites, and using as an etching stopper the barrier layer 106 is next removed using NMD3 solution (an aqueous solution containing 0.2 to 0.5% of tetramethyl ammonium hydroxide). The oxide film barrier layer is then removed by using diluted hydrofluoric acid.

Next, a description will be made with reference to FIG. 3A. The surface of the crystalline semiconductor film obtained is processed with aqueous ozone, forming an extremely thin oxide film (not shown in the figures). A mask made form resist is formed thereon and patterned, and the crystalline semiconductor film is next etched into predetermined shapes, forming separated semiconductor layers 121 to 124. The mask made from resist is then removed.

An insulating film 125 that becomes a gate insulating film, and which has silicon as its main constituent, is formed next after cleaning the surface of the silicon film. A silicon oxynitride film having a film thickness of 155 nm is formed by plasma CVD at a film formation temperature of 400° C. in this embodiment, using $SiH_4$ and $N_2O$ as film formation gasses at a gas flow rate ratio of 4/800 sccm.

A first conductive film having a film thickness of 20 to 100 nm, and a second conductive film having a film thickness of 100 to 400 nm are laminated next on the gate insulating film. A tantalum nitride (TaN) film 126 having a film thickness of 30 nm is laminated on the gate insulating film, and a tungsten (W) film 127 having a film thickness of 370 nm is laminated on the tantalum nitride (TaN) film, in that order.

The first conductive film and the second conductive film are formed of an element selected from the group consisting of tantalum (Ta), tungsten (W), titanium (Ti), molybdenum (Mo), aluminum (Al), and copper (Cu), or an alloy or chemical compound mainly containing the elements. Further, as the first conductive film and the second conductive film, a semiconductor film, typically a polycrystalline silicon film into which an impurity such as phosphorus has been doped, and an alloy film made from silver, palladium, and copper (AgPdCu alloy film) may also be used. Further, there are no limitations placed on using a two layer structure, and a three layer structure may also be used, for example, in which a tungsten film having a film thickness of 50 nm, an alloy film of aluminum and silicon (Al—Si alloy film) having a film thickness of 500 nm, and a titanium nitride film having a film thickness of 30 nm are laminated in order. Further, if a three layer structure is employed, tungsten nitride may also be used as a substitute for tungsten in a first conductive film, an alloy of aluminum and titanium may also be used as a substitute for the alloy of aluminum and silicon in a second conductive film, and a titanium film may also be used as a substitute for the titanium nitride film in a third conductive film. Furthermore, a single layer structure may also be used.

Next, a description will be made with reference to FIG. 3B. Masks 128 to 131 made from resist are formed by exposure to light in a photolithography process, and a first etching process is performed in order to form gate electrodes and wirings (not shown in the figures). The first etching process is performed under first and second etching conditions. An ICP (inductively coupled plasma) etching method may be used for etching. Films can be etched to have a desired tapered shape by suitably regulating the etching conditions (such as the amount of electric energy applied to a coil shape electrode, the amount of electric energy applied to a substrate side electrode, the temperature of the substrate side electrode, and the like) when using ICP etching. Note that chlorine gasses, typically chlorine ($Cl_2$), boron trichloride ($BCl_3$), silicon tetrachloride ($SiCl_4$), carbon tetrachloride ($CCl_4$), and the like, fluorine gasses, typically carbon tetrafluoride $CF_4$, sulfur hexafluoride ($SF_6$), nitrogen trifluoride ($NF_3$), and the like, and oxygen ($O_2$) can be suitably used as etching gasses.

Etching is performed under the first etching conditions in this embodiment by using carbon tetrafluoride ($CF_4$), chlorine ($Cl_2$), and oxygen ($O_2$) as etching gasses, setting their respective gas flow rates to 25/25/10 sccm, and introducing a 500W RF (13.56 MHz) power to a coil shape electrode at a pressure of 1.5 Pa, thus generating a plasma. A 150 W RF (13.56 MHz) electrode is also introduced to a substrate side (sample stage), thus in effect applying a negative self-bias voltage. Note that the size of the electrode surface area on the substrate side is 12.5 cm×12.5 cm, and the size of the surface area of the coil shape electrode (a quartz disk on which a coil is formed here) is a diameter of 25 cm. The tungsten film is etched by the first etching conditions, and an edge portion of the first conductive layer takes on a tapered shape. The etching rate of the tungsten film at the first etching conditions is 200.39 nm/min, and the etching rate of the tantalum nitride film is 80.32 nm/min, and therefore the selection ratio of tungsten to tantalum nitride is approximately 2.5. Further, the tungsten taper angle becomes approximately 26° under the first etching conditions.

The etching conditions are next changed to the second etching conditions without removing the masks 128 to 131 made from resist. Etching is then performed for a period on the order of approximately 15 seconds using carbon tetrafluoride ($CF_4$) and chlorine ($Cl_2$) as etching gasses, setting their respective gas flow rates to 30/30 sccm, and introducing a 500 W RF (13.56 MHz) electrode to the coil shape electrode at a pressure of 1.5 Pa, thus generating a plasma. A 10 W RF (13.56 MHz) electrode is also introduced to the substrate side (sample stage), in effect applying a negative self-bias. The tungsten film and the tantalum nitride film are etched by a similar amount under the second etching conditions, in which carbon tetrafluoride ($CF_4$) and chlorine ($Cl_2$) are mixed. The etching rate of tungsten under the second etching conditions is 58.97 nm/min, and the etching rate of tantalum nitride is 66.43 nm/min. Note that the etching time may also be increased by on the order of 10 to 20% in order to perform etching without any residue remaining on the gate insulating film.

First shape conductive layers 132 to 135, including first conductive layers and second conductive layers (first conductive layers 132a to 135a and second conductive layers 132b to 135b), are thus formed by the first etching process. The insulating film 125 that becomes the gate insulating film is etched by an amount on the order of 10 to 20 nm, and regions not covered by the first conductive layers 131 to 134 become a thinned gate insulating film 136.

Next, a description will be made with reference to FIG. 3C. A second etching process is performed next without removing the masks 128 to 131 made from resist. Etching is performed here for a period on the order of 25 seconds by using sulfur hexafluoride ($SF_4$), chlorine ($Cl_2$), and oxygen ($O_2$) as etching gasses, setting their respective gas flow rates to 24/12/24 sccm, and introducing a 700 W RF (13.56 MHz) electrode to the coil shape electrode at a pressure of 2.0 Pa, thus generating a plasma. A 4 W RF (13.56 MHz) electrode is also introduced to the substrate side (sample stage) to sufficiently apply a negative self-bias. The etching rate of tungsten (W) by the second etching process is 227.3 nm/min, and the selection ratio of tungsten to tantalum nitride (TaN) is 7.1. The etching rate of the silicon oxynitride film as an insulating film 136 is 33.7 nm/min, and the selection ratio of W to the silicon oxynitride film is 6.83. The selection ratio to the insulating film 136 is thus high when using sulfur hexafluoride ($SF_6$) in the etching gas, and therefore film reduction can be suppressed.

Second conductive layers 137b to 140b are formed by the second etching process. The taper angle of the second conductive layers 137b to 140b, which are tungsten films, becomes approximately 70°. On the other hand, the first conductive films are hardly etched at all, and become first conductive layers 137a to 140a. Further, the masks 128 to 131 made from resist become masks 145 to 148 made from resist due to the second etching process.

Next, a description will be made with reference to FIG. 3D. A first doping process is performed after removing the masks 145 to 148 made from resist, and the state of FIG. 3D is obtained. The doping process may be performed by ion doping or ion injection. The conditions of ion doping are such that phosphorus (P) is doped with a dosage of $5 \times 10^{13}$/$cm^2$ and an acceleration voltage of 50 kV. As (arsenic) may also be used as a substitute for P (phosphorus) as an impurity element that imparts n-type conductivity. The first conductive films 131 to 134 and the second conductive films 137 to 140 become masks with respect to impurity elements imparting the n-type conductivity in this case, and first impurity regions 141 to 144 are formed in a self-aligning manner. The impurity element that imparts n-type conductivity is added to the first impurity regions 141 to 144 at a concentration ranging from $1 \times 10^{16}$ to $\times 10^{17}$/$cm^3$. Regions having the same concentration range as the first impurity regions are referred to as n-regions here.

Note that, although the first doping process is performed in this embodiment after removing the masks 145 to 148 made from resist, the first doping process may also be performed without removing the masks 145 to 148 made from resist.

Figure 4A:
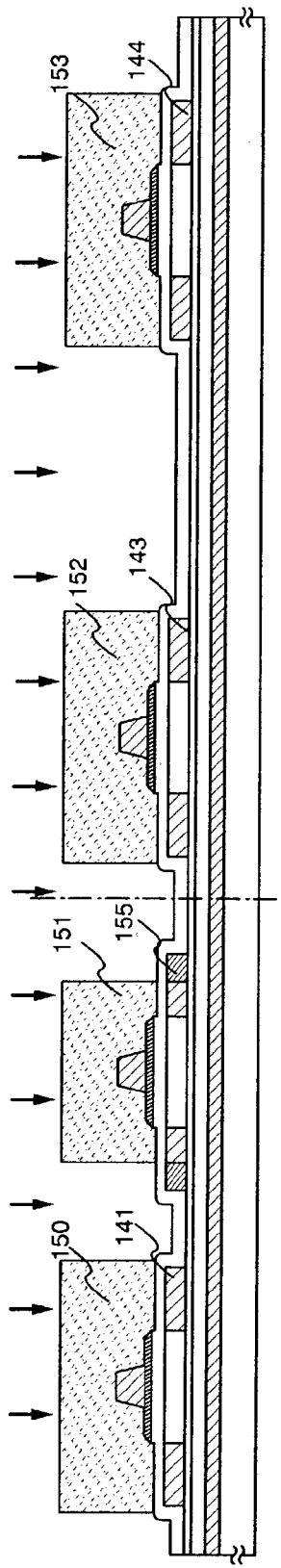
FIGS. 4A to 4C are cross sectional diagrams showing the process of manufacturing the active matrix substrate in accordance with Embodiment 1 of the present invention.

Next, a description will be made with reference to FIG. 4A. Masks 150 to 153 made from resist are formed, and a second doping process is performed. The mask 150 is a mask that protects a channel formation region of a semiconductor layer for forming a p-channel TFT of a driver circuit, and regions in the periphery of the channel formation region. The mask 151 is a mask that protects a channel formation region of a semiconductor layer for forming one n-channel TFT of the driver circuit, and regions in the periphery of the channel formation region. The masks 152 and 153 are masks that protect a channel formation region of a semiconductor layer for forming a pixel region TFT, and regions in the periphery of the channel formation region.

The ion doping conditions in the second doping process are such that phosphorus (P) is doped at a dosage of $3.5 \times 10^{15}/cm^2$ and an acceleration voltage of 65 kV, thus forming a second impurity region 155. An impurity element that imparts n-type conductivity is added to the second impurity region 155 at a concentration range of $1 \times 10^{20}$ to $1 \times 10^{21}/cm^3$. Regions having the same concentration range as the second impurity region are referred to as n+ regions here.

Figure 4B:
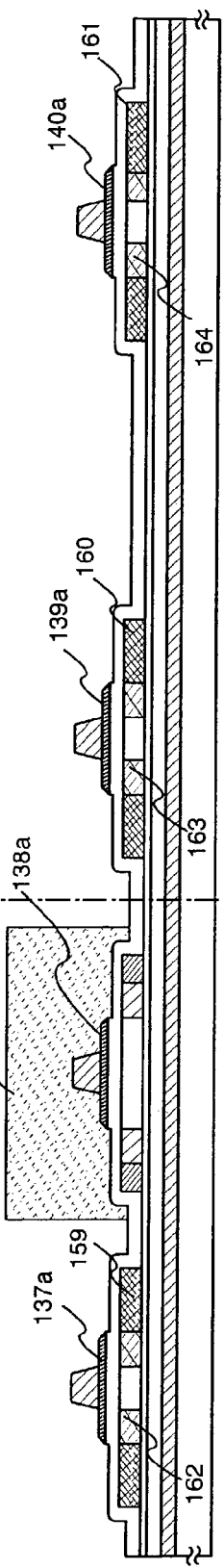

Next, a description will be made with reference to FIG. 4B. The masks 150 to 153 made from resist are removed, a mask 158 made from resist is newly formed, and a third doping process is performed.

Third impurity regions 150 to 161 and fourth impurity regions 162 to 164, in which an impurity element that imparts p-type conductivity is added to semiconductor layers that form p-channel TFTs, are formed by the third doping process in the driver circuits.

Impurity element addition is performed so that an impurity element imparting a p-type conductivity is added to the third impurity regions 159 to 161 in a concentration range of $1 \times 10^{20}$ to $1 \times 10^{21}/cm^3$. Note that, although there are regions (n− regions) in the third impurity regions 159 to 161 to which P (phosphorus) is added in the previous process, the impurity element imparting the p-type conductivity is added at a concentration 1.5 to 3 times that of the impurity element imparting the n-type conductivity, and therefore the conductivity type in the third impurity regions 159 to 161 becomes p-type. Regions having the same concentration range as the third impurity regions are referred to as p+ regions here.

Further, an impurity element addition is performed so that an impurity element imparting a p-type conductivity is added to the fourth impurity regions 162 to 164 in a concentration range of $1 \times 10^{18}$ to $1 \times 10^{20}/cm^3$. Regions having the same concentration range as the fourth impurity regions are referred to as p-regions here.

The impurity regions having n-type conductivity or p-type conductivity are thus formed in each of the semiconductor layers by the above processes. Conductive layers 137 to 140 become TFT gate electrodes.

Figure 4C:
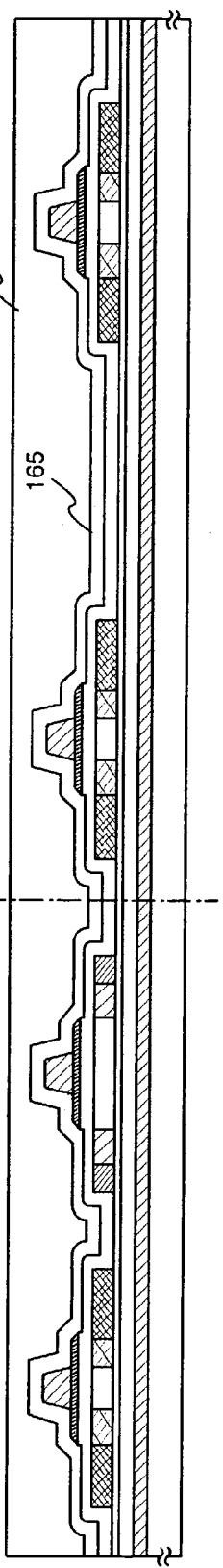

Next, a description will be made with reference to FIG. 4C. Heat treatment is performed at a temperature of 300 to 550° C. for 1 to 12 hours after forming a first passivation film 165 made from a silicon nitride film having a film thickness of 100 nm. The semiconductor layers are thus hydrogenated. Heat treatment is performed at 410° C. for 1 hour within a nitrogen atmosphere in this embodiment. This process is one of terminating dangling bonds in the semiconductor layers by hydrogen contained in the first passivation film 165.

A first interlayer insulating film 166 made from an inorganic insulator or an organic insulator is formed on the first passivation film next. Positive photosensitive organic resins and negative photosensitive organic resins can be used as organic insulators. A first opening portion having curvature can be formed for cases of using a photosensitive organic resin if exposure processing is performed by a photolithography process, and the photosensitive organic resin is then etched. The formation of the opening portion having curvature has an effect for increasing the coverage of an electrode formed later. A photosensitive acrylic resin film having a thickness of 1.05 μm is formed for the first interlayer insulating film in this embodiment. Patterning and etching of the first interlayer insulating film are performed next, forming the first opening portion having inner walls with a gentle slope.

Note that positive photosensitive resins are colored brown, and therefore it is necessary to perform decolorization of the photosensitive organic resin after etching if a positive photosensitive organic resin is used in the first interlayer insulating film 166.

Further, if a film made from an inorganic insulator is used in the first interlayer insulating film 166, a surface thereof may also be leveled.

A second passivation film 180 made from a nitride insulating film (typically a silicon nitride film or a silicon oxynitride film) is formed next so as to cover the opening portion and the first interlayer insulating film. A silicon nitride film is used in the second passivation film in this embodiment. As the film formation conditions, sputtering is performed at high frequency discharge using a silicon target and using nitrogen gas as sputtering gas. The pressure may be suitably set, and a pressure of 0.5 to 1.0 Pa, a discharge power of 2.5 to 3.5 KW, and a film formation temperature within a temperature range of room temperature (25° C.) to 250° C. may be used. Degassing from the first interlayer insulating film, can be controlled by forming the second passivation film made from a nitride insulating film.

It is possible to prevent moisture from the substrate side and gasses due to degassing from the first interlayer insulating film from entering EL elements formed later by forming the nitride insulating film on the first interlayer insulating film. Deterioration of the EL elements can thus be suppressed. Further, the nitride insulating film has an effect in making bonded two-sided tape easy to peel off in the following peeling process, and a process for removing remaining adhesive is not necessary, and therefore process can be simplified.

Next, after performing exposure processing by using a photolithography process, the second passivation film 180, the first passivation film 165, and the gate insulating film 136 are etched in order, forming a second opening portion. Dry etching or wet etching may be used as an etching process at this point. The second opening portion is formed by dry etching in this embodiment.

After forming the second opening portion, a metallic film is formed next on the second passivation film and in the second opening portion. The metallic film is etched after light exposure by a photolithography process, thus forming source and drain electrodes 181 to 188, and wirings (not shown in the figures). As the metallic film, a film made from an element selected from the group consisting of aluminum (Al), titanium (Ti), molybdenum (Mo), tungsten (W), and silicon (Si), or an alloy film made of these elements is used. After laminating a titanium film, a titanium aluminum alloy film, and a titanium film (Ti/Al—Si/Ti) having film thicknesses of 100 nm, 350 nm, and 100 nm, respectively, and the laminate is patterned into a desired shape through etching, thus forming source electrodes, drain electrodes, and wirings (not shown in the figures).

A pixel electrode 190 is formed next. Transparent conductive films such as ITO, $SnO_2$, and the like can be used for the pixel electrode 190. In this embodiment, an ITO film with a thickness of 110 nm is formed and etched into a desired shape, thus forming the pixel electrode 190.

Note that, although the pixel electrode 190 is made into a transparent electrode in this embodiment because a method of manufacturing a transmitting (downward emission type) display device is discussed, it is preferable to use a material having superior reflectivity, such as a film having aluminum (Al), or silver (Ag) as its main constituent, or a laminate structure of these films, for the pixel electrode when manufacturing a reflective (upward emission type) display device.

Next, a description will be made with reference to FIG. 5B. Exposure processing is performed by a photolithography process after forming a film made from an organic insulator on the second passivation film, the source electrodes, the drain electrodes, and the pixel electrode. A second interlayer insulating film 200 is then formed by etching the film made from an organic insulator and forming a third opening portion. Positive photosensitive organic resins and negative photosensitive organic resins can be used as the organic insulator. The second interlayer insulating film is formed by using a photosensitive acrylic resin having a thickness of 1.5 µm, and then etched by wet etching in this embodiment.

A third passivation film 315 is then formed on the second interlayer insulating film 200, after which a fourth opening portion is formed on the pixel electrode 190. Degassing that develops from the second interlayer insulating film can be suppressed by covering the second interlayer insulating film 200 with the third passivation film 315. It is effective to use a film made from a nitride insulating film (typically a silicon nitride film or a silicon oxynitride film) as the third passivation film.

A driver circuit 201 composed of a p-channel TFT 195 and an n-channel TFT 196, and a pixel portion 202 having a pixel TFT 197 and a p-channel TFT 198 can thus be formed on the same substrate. An active matrix substrate A 203 is thus completed. A process for peeling the glass substrate away from the active matrix substrate A and transferring it to a plastic substrate is shown next.

Figure 6A:
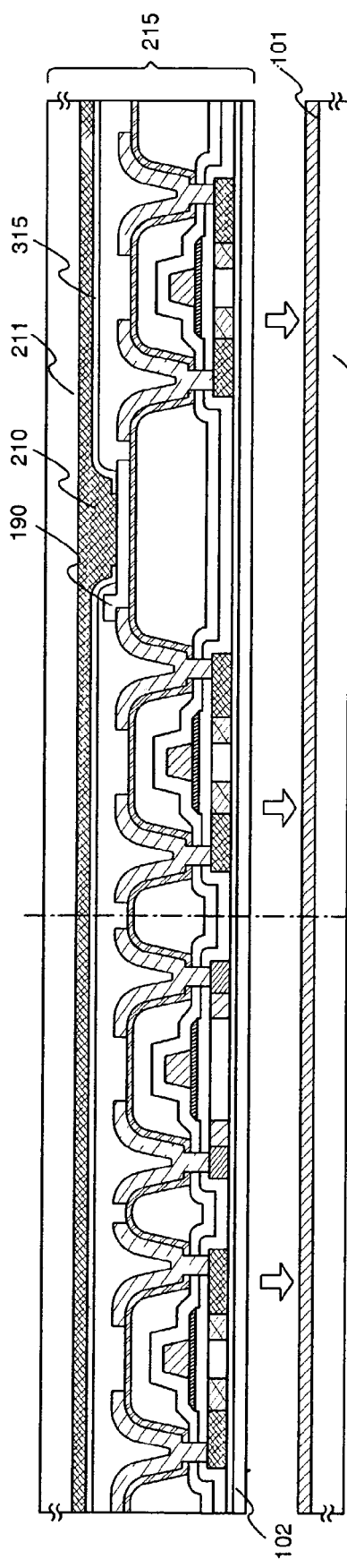
FIGS. 6A and 6B are cross sectional diagrams showing a peeling process and a transferring process, respectively, of the active matrix substrate in accordance with Embodiment 1 of the present invention.

Next, a description will be made with reference to FIG. 6A. One surface of a two-sided tape 210 is bonded to the third passivation film and the pixel electrode 190. There is a danger that the tungsten film 101, which is a peeling layer, and, the glass substrate cannot be peeled uniformly from the active matrix substrate A 203 if air bubbles enter between the two-sided tape 210 and the second interlayer insulating film 200 or the pixel electrode 190 at this point, and therefore it is necessary to perform bonding so that air bubbles are not introduced. Two-sided tape having an ultraviolet-peeling adhesive on one side, and a heat-peeling adhesive on the other side is used in this embodiment, and the side having the ultraviolet-peeling adhesive is bonded to the third passivation film 315 and the pixel electrode 190. Of course, two-sided tape having ultraviolet-peeling adhesive on both sides may be used.

Next, a support 211 is bonded to the other surface of the two-sided tape 210 (the side having the heat-peeling adhesive). For the support 211, quartz glass, metals, ceramics, and the like can be used. Note that the two-sided tape 210 and the support 211 must be securely fixed together. This is for preventing the support 211 and the two-sided tape from peeling apart when peeling the substrate from the active matrix substrate A 203. Quartz glass is used for the support 211 in this embodiment, and the surface of the two-sided tape having the heat-peeling adhesive is bonded to the quartz glass.

The metallic layer 101 and the glass substrate 100 are next peeled away from the active matrix substrate by applying a physical force to the nitride layer or metallic layer 101 and the layer 102 made from an oxide film. The active matrix substrate from which the glass substrate 100 has been peeled away is denoted as an active matrix substrate B 215. An example in which the mechanical strength of the glass substrate 100 is sufficient is shown here. There is a possibility that the glass substrate 100 will break if the adhesion between the nitride layer or metallic layer 101 and the layer 102 made from an oxide film is strong, and the mechanical strength of the glass substrate 100 is weak. It is therefore possible to perform peeling more effectively if a support (not shown in the figures), for example, plastic, glass, metal, ceramic, or the like, is bonded to a rear surface of the glass substrate (surface on which the TFTs are not formed) before peeling.

Next, a description will be made with reference to FIG. 6B. The layer 102 made from an oxide film is bonded to a transferring member 213 by using an adhesive 212. It is possible to use reaction setting adhesives, thermal setting adhesives, or photosetting adhesives such as ultraviolet setting adhesives as the adhesive 212, and epoxy resins, acrylic resins, silicon resins, and the like can be given as typical examples thereof. An ultraviolet setting adhesive is used for the adhesive 212, and polycarbonate film is used for the transferring member 213 in this embodiment. The bonding conditions may be suitably set, and the polycarbonate film is fixed to the active matrix substrate by irradiating ultraviolet light for 120 seconds while heating on a hotplate to a temperature on the order of 50 to 100° C.

The two-sided tape 210 and the support 211 are peeled away from the active matrix substrate B 215 next. After initially heating to a temperature of 90 to 150° C., preferably 110 to 120° C., the quartz glass substrate 211 is peeled away from the two-sided tape 210. UV irradiation is performed for 60 seconds, and the two-sided tape 210 is peeled away from the second interlayer insulating film 200 and the pixel electrode 190.

Although this embodiment adopts the two-sided tape in which an ultraviolet-peeling adhesive is used on the side of the object to be peeled and a heat-peeling adhesive is used on the support side, the adhesives are not limited to this combination. It is also possible to use a two-sided tape in which a heat-peeling adhesive is used on the object to be peeled, and a heat-peeling adhesive is used on the support. Similarly, it is also possible to use two-sided tape having only heat-peeling adhesives, and two-sided tape having only ultraviolet-peeling adhesives. In addition, it is also possible to use light peeling adhesives and reaction peeling adhesives, and the respective peeling conditions may be suitably set.

The thin film transistors can be transferred onto the plastic substrate by the above processes.

Next, the voltage-current characteristics of the thin film transistors transferred according to this embodiment are shown in FIGS. 14A and 14B. Note that $V_{ds}$ (the voltage difference between a source region and a drain region) is set to 1V.

First, a description will be made with reference to FIG. 14A. FIG. 14A shows the electrical characteristics of the n-channel TFTs. The electrical characteristics of the n-channel TFTs transferred onto the plastic substrate show almost no change for the electrical characteristics of the TFTs before the transfer, that is, the electrical characteristics of the n-channel TFTs formed on the glass substrate hardly change. It is thus understood that the n-channel TFTs are transferred onto the plastic substrate without developing defects thereof.

Next, a description will be made with reference to FIG. 14B. FIG. 14B shows the electrical characteristics of the p-channel TFTs. Similarly to FIG. 14A, the electrical characteristics of the p-channel TFTs transferred onto the plastic substrate show no change with the electrical characteristics of the TFTs before the transfer, that is, the electrical characteristics of the p-channel TFTs formed on the glass substrate hardly change. It is thus understood that the p-channel TFTs are transferred onto the plastic substrate without developing defects thereof.

It is thus possible to transfer thin film transistors formed on a glass substrate onto a plastic substrate in a short time by using two-sided tape having an ultraviolet-peeling adhesive or a heat-peeling adhesive. Moreover, thin film transistors having electrical characteristics equivalent to those of thin film transistors manufactured on glass substrates can be manufactured on plastic substrates.

Further, it is possible to peel away a quartz glass substrate, which is a support, without causing any damage thereof by using two-sided tape when peeling the object to be peeled, which contains thin film transistors, from a glass substrate. The support can thus be reused. A large reduction in cost can therefore be achieved for cases in which expensive materials like quartz glass are used for the support.

In addition, the surface of the object to be peeled is exposed, and therefore it is possible to measure the electrical characteristics of thin film transistors after transferring them to a plastic substrate.

[Embodiment 2]

Figure 7A:
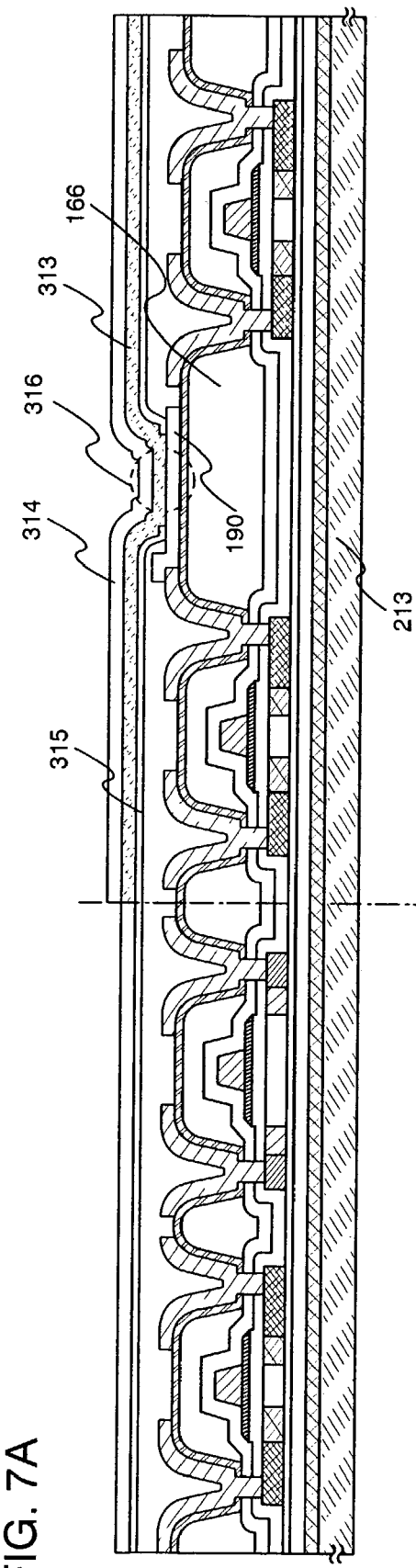
FIGS. 7A and 7B are cross sectional diagrams showing a process of manufacturing an EL module in accordance with Embodiment 2 of the present invention.
Figure 7B:
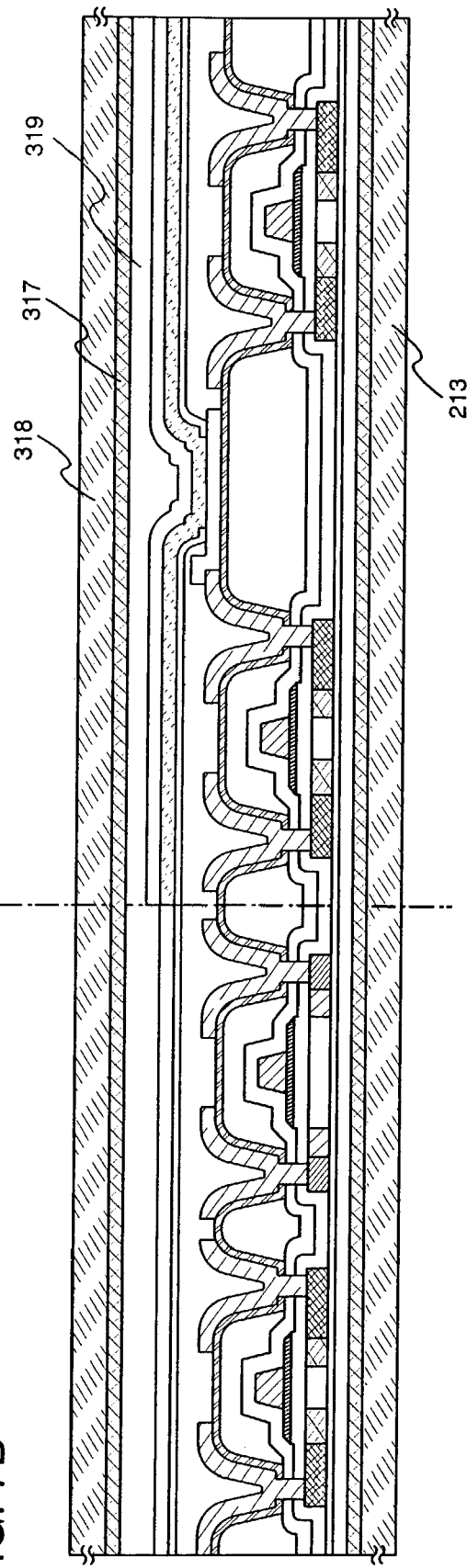

An example of making an El module provided with EL (electro-luminescence) elements 316 formed on a plastic substrate is explained in this embodiment. FIGS. 7A and 7B are used in the explanation.

Figure 6B:
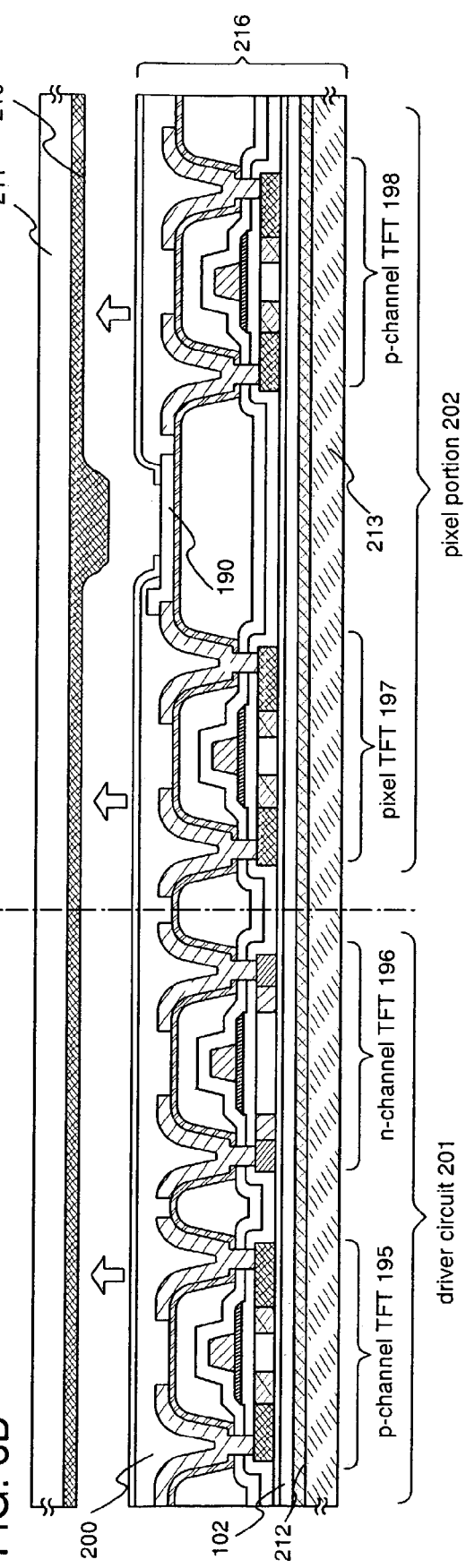

First, an active matrix substrate C 216 of FIG. 6B is manufactured in accordance with Embodiment 1, and then an EL layer 313 is formed on the third passivation film 315 and the pixel electrode 190. The EL layer 313 is generally structured by a laminate of thin films, such as light emitting layers, charge injecting layers, and charge transporting layers. Thin films made from light emitting materials that emit light (fluoresce) through singlet excitation (singlet compounds) and thin films made form light emitting materials that emit light (phosphoresce) through triplet excitation (triplet compounds) can be used as the EL layer. Further, each layer of the EL layer 313 may be a thin film made from an organic material solely, and may be a laminate structure of a thin film made from an organic material and a thin film made form an inorganic material. In addition, the organic material may be high molecular weight or low molecular weight ones. Known materials can be used for these organic materials and inorganic materials. As film formation methods for each layer, known means are adopted. A CuPc film having a film thickness of 20 nm, an α-NPD film having a film thickness of 30 nm, an Alq$_3$ film having a film thickness of 50 nm, and a BaF$_2$ film having a film thickness of 2 nm are laminated by evaporation in this embodiment, thus forming the EL layer 313.

A cathode 314 is formed next on the EL layer 313, and in addition, a fourth passivation film (not shown in the figures) is formed on the cathode 314. For the cathode 314, a metallic thin film containing an element belonging to Group 1 or Group 2 of the periodic table may be used, and a metallic film in which 0.2 to 1.5% (preferably 0.5 to 1.0%) by weight of lithium is added to aluminum is suitable due to its charge injecting characteristics and the like. Note that the diffusion of lithium elements into the thin film transistors is controlled by the first to fourth passivation films with the present invention, and therefore the lithium elements do not affect the operation of the thin film transistors.

The EL element 316 is thus formed by the pixel electrode 190, the EL layer 313, and the cathode 314 through the above processes.

The structure shown in FIG. 7A concerns a downward emission light emitting device, and light emitted from the EL element passes through the pixel electrode 190 and is emitted from the plastic substrate 213 side.

On the other hand, by using a metallic film having reflectivity as a substitute for the pixel electrode 190, and using a metallic film having a small film thickness (preferably from 10 to 50 nm) in the cathode 314, light emitted form the EL element passes through the cathode and is emitted. Metallic films made of Pt (platinum) and Au (gold), which have high work functions, are used as the metallic film having reflectivity in order to make the metallic film function as an anode. A metallic film containing an element belonging to Group 1 or Group 2 of the periodic table is used in the cathode.

Light does not pass through the portion below the pixel electrode with this type of upward emission light emitting device, and therefore it is possible to form memory elements and resistive elements, and there are no problems associated with the first interlayer insulating film 166 being colored. Consequently, it is also possible to achieve a high degree of freedom in design, and further, to simplify the manufacturing processes.

Next, a description will be made with reference to FIG. 7B. A third interlayer insulating film is formed on a fourth passivation film. It is preferable that a surface of a third interlayer insulating film 319 be further leveled after formation. Note that it is not always necessary to form the third interlayer insulating film 319.

An EL element is sealed by bonding an opposing substrate 318 thereto by using an adhesive layer 317. Plastics such as PES (polyethylene sulfide), PC (polycarbonate), PET (polyethylene terephthalate), and PEN (polyethylene naphthalate) can be used for the opposing substrate. A polycarbonate film is used in this embodiment. Note that it is necessary that the plastic substrate be made of a material having light transmitting characteristics for cases in which a metallic film having reflectivity is used as a substitute for the pixel electrode 190, and a metallic film having a small film thickness (preferably from 10 to 50 nm) is used as the cathode 314. An epoxy resin is used as the adhesive layer 317, and a polycarbonate film is used as the opposing substrate in this embodiment. If substrates made from the same material are used for the substrate 213, which is the transferring member, and the opposing substrate 318, then their thermal expansion coefficients are equal, and the substrate is unsusceptible to the influence of stress strain due to temperature change.

Further, the transferring member 213 and the opposing substrate 318 are divided into a desired shape as needed. Then, the FPC (not shown in the figures) is bonded thereto by using a known technique.

Figure 15:
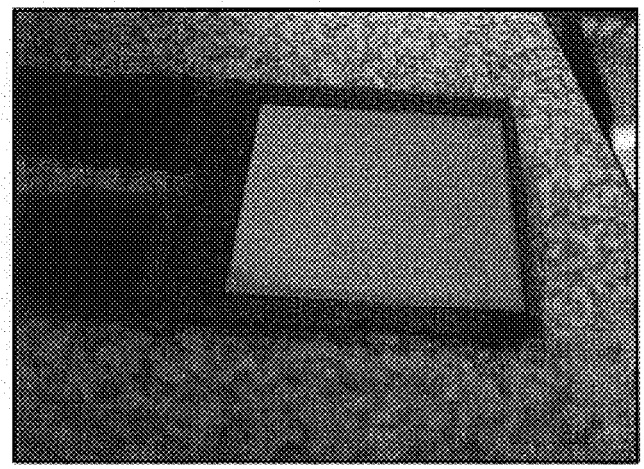
FIG. 15 is a photograph showing the EL module manufactured in accordance with Embodiment 2 of the present invention.

Next, a description will be made with reference to FIG. 15. FIG. 15 is a photograph of an upper surface of an EL module manufactured according to this embodiment. From this photograph, it can be understood that an EL module manufactured on a plastic substrate by the processes of this embodiment emits light. Further, polycarbonate films are used in a transferring member for the EL module and an opposing substrate, and therefore an extremely thin EL module can be manufactured.

[Embodiment 3]

Figure 8:
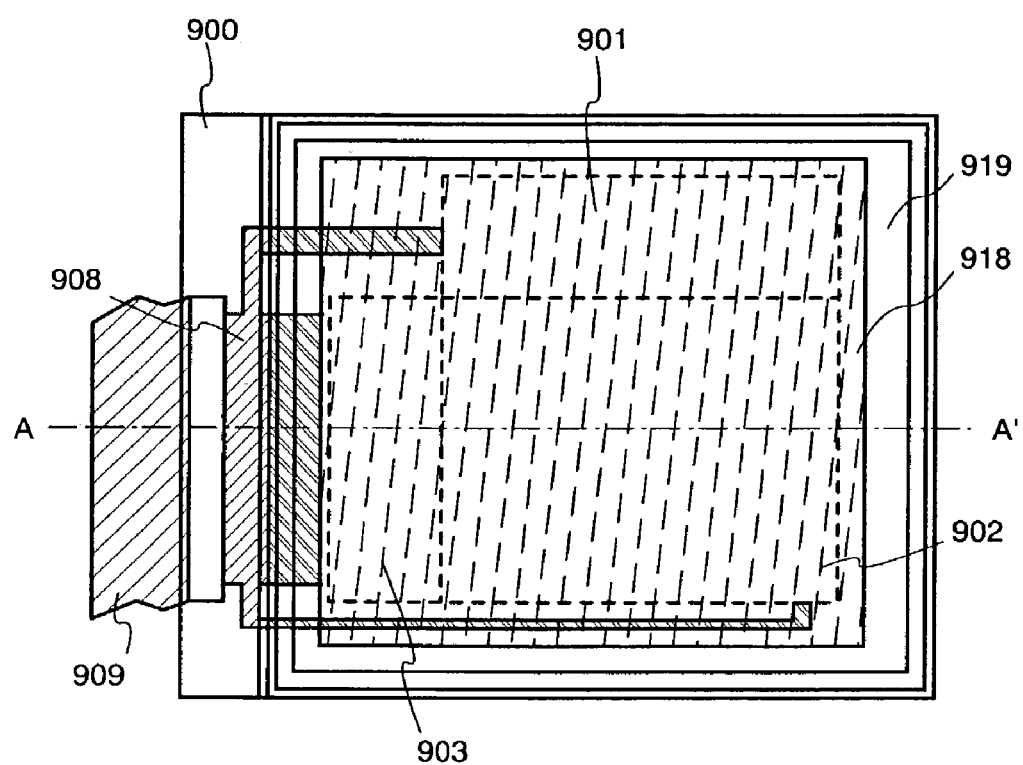
FIG. 8 is a top view of an EL module in accordance with Embodiment 3 of the present invention.

The structures of an EL module obtained according to Embodiment 1 and Embodiment 2 are explained using the top view of FIG. 8. The transferring member 213 in Embodiment 2 corresponds to a plastic substrate 900.

FIG. 8 is a top view showing a module (hereinafter referred to as EL module) having a light emitting device provided with an EL element. A pixel portion 902, a source side driver circuit 901, and a gate side driver circuit 903 are formed on a plastic substrate 900 (typically a plastic film substrate). The pixel portion and the driver circuits can be manufactured by the above embodiments.

Further, reference numeral 918 denotes a sealing material, and reference numeral 919 denotes a protective film. The sealing material 918 covers the pixel portion and the driver circuit portion, and the protective film 919 covers the sealing material. Note that it is preferable to use a material that is as transparent or semi-transparent as possible with respect to visible light as the sealing material 918. Further, it is preferable that the sealing material 918 be a material through which moisture and oxygen pass as less as possible. The light emitting element can be completely shut off from the outside by sealing it using the sealing material 918 and the protective film 919. Substances from the outside such as moisture and oxygen, which promote deterioration such as oxidation in EL layer can thus be prevented from entering. In addition, heat generated during driving can be radiated when using a film that has thermal conductivity (such as an AlON film, or an AlN film) as the protective film and a light emitting device having high reliability can be obtained.

In addition, it is sealed with an opposing substrate (not shown in the figure) using an adhesive material. There are no particular limitations placed on the shape of the opposing substrate and the shape of a support, and those having a flat surface, those having a curved surface, those having flexibility, and those having a film shape may be used. It is preferable that the opposing substrate be made of the same material as the film substrate 900, for example a plastic substrate, in order to withstand deformation due to heat, external forces, and the like.

Further, although not shown in the figure, circular polarizing means, called a circular polarization plate and composed of a retardation plate ($\lambda/4$ plate) or a polarization plate, may also be provided on the substrate 900 in order to prevent the background from being reflected therein by reflection from the metallic layers used (a cathode and the like, in this case).

Note that reference numeral 908 denotes wirings for transmitting signals input to the source side driver circuit 901 and the gate side driver circuit 903, and video signals and clock signals from an FPC (flexible printed circuit) 909, which becomes an external input terminal, are received therethrough. Further, the light emitting device of this embodiment may adopt digital drive and analog drive, and the video signals may be digital signals and may be analog signals. Note that, although only an FPC is shown in the figure, a printed wiring board (PWB) may also be attached to the FPC. The category of the light emitting device defined in this specification includes not only the light emitting device main body, but also the ones in the form of the FPC and the PWB being attached thereto. Further, although it is also possible to form a complex integrated circuit (such as a memory, a CPU, a controller, or a D/A converter,) on the same substrate as the pixel portion and the driver circuits, it is difficult to manufacture them by using a small number of masks. It is therefore preferable to mount an IC chip provided with a memory, CPU, controller, D/A controller, and the like by using a COG (chip on glass) method, a TAB (tape automated bonding) method, or a wire bonding method.

An EL module having highly reliable thin film transistors with good electrical characteristics can be manufactured on a plastic substrate by the above processes. Further, an extremely small size, lightweight EL module can be manufactured by using a plastic film for the plastic substrate.

[Embodiment 4]

An example of manufacturing a liquid crystal module formed on a plastic substrate is explained in this embodiment. FIGS. 9A and 9B are used in the explanation.

First, a description will be made with reference to FIG. 9A. After obtaining the active matrix substrate C 216 in the state of FIG. 6B in accordance with Embodiment 1, an orientation film is formed on the active matrix substrate C of FIG. 6B by using a known technique within a temperature range which the substrate is capable of withstanding. An orientation film 617 is then formed and a rubbing process is performed, thus manufacturing an active matrix substrate D 600.

Note that an element a601, an element b602, an element c603, and an element d604 of FIG. 9A correspond to the p-channel TFT 195, the n-channel TFT 196, the pixel TFT 197, and the p-channel TFT 198 of FIG. 6B, respectively. Note also that a known technique may be used in order to level the surface of the active matrix substrate. After forming source electrodes and drain electrodes 605 to 612, and wirings (not shown in the figures), a second interlayer insulating film is formed. In addition, a second opening portion is formed, and the connection wiring 614 and pixel electrodes 615 and 616 are formed.

An opposing substrate 620 is prepared next. Plastics such as PES (polyethylene sulfide), PC (polycarbonate), PET (polyethylene terephthalate), and PEN (polyethylene naphthalate) can be used in the opposing substrate. Color filters (not shown in the figures), in which colored layers and light blocking layers are disposed corresponding to each pixel, are formed on the opposing substrate 620. Further, a light blocking layer (not shown in the figures) is also formed in a driver circuit portion. A leveling film (not shown in the figures) is formed covering the color filters and the light blocking layers. An opposing electrode 621 made from a transparent electrode is formed next on the leveling film, an orientation film 622 is formed over the entire opposing substrate, and a rubbing process is performed. These processes can be performed using known techniques within a temperature range which the opposing substrate is capable of withstanding.

The active matrix substrate D 600, on which a pixel portion and driver circuits are formed, and the opposing substrate 620 are next bonded by using a sealing material 624. A filler is mixed into the sealing material, and the two substrates are bonded together with a uniform gap due to the filler. A liquid crystal material 623 is then injected between both substrates and then completely sealed by using a sealant (not shown in the figures). Known liquid crystal materials may be used for the liquid crystal material.

If necessary, the active matrix substrate D 600 and the opposing substrate 620 are sectioned into desired shapes. In addition, a polarization plate (not shown in the figures) and the like may be suitably formed by using known techniques. An FPC (not shown in the figures) may also be bonded by using a known technique.

Note that plastic substrates having flexibility, such as plastic films, can be used for the plastic substrate 213 and for the opposing substrate 620, provided that a structure is employed in which a fixed thickness is maintained for the liquid crystal display device.

An active matrix liquid crystal module having high reliability and good electrical characteristics can thus be manufactured. Plastic is used in the substrates, and therefore an extremely lightweight liquid crystal module can be manufactured.

[Embodiment 5]

Figure 10:
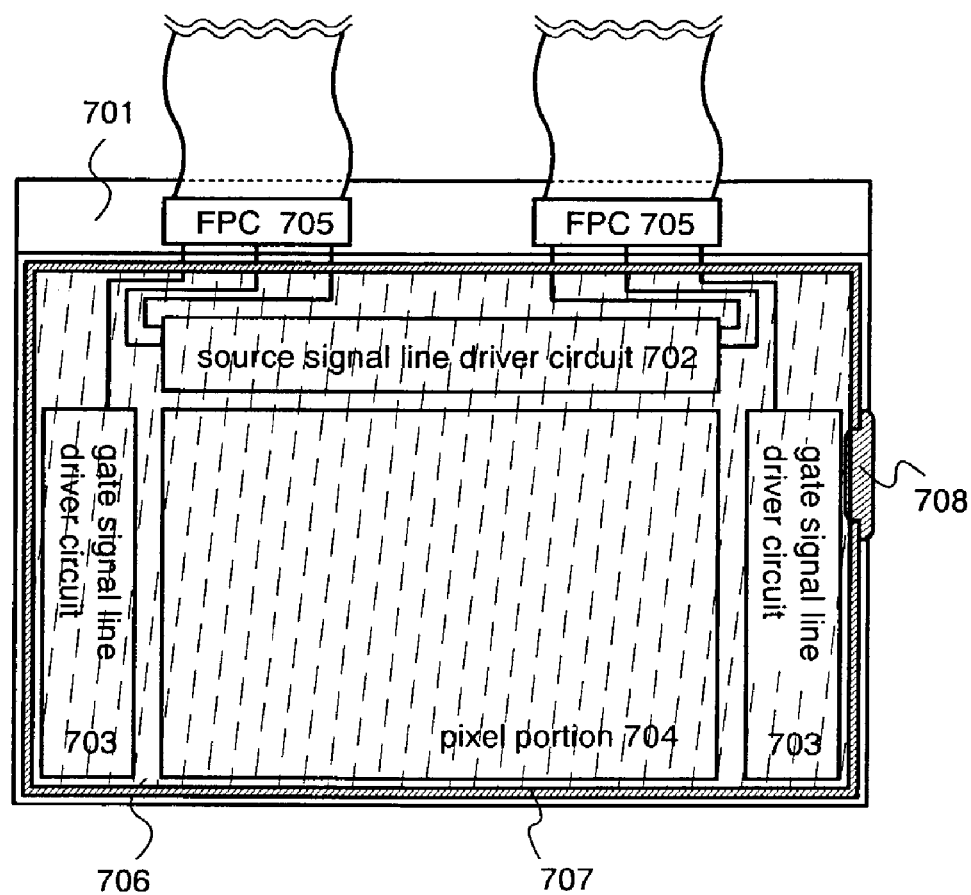
FIG. 10 is a top view of a liquid crystal module in accordance with Embodiment 5 of the present invention.

The structure of the thus obtained liquid crystal module based on Embodiments 1 and 4 is described with reference to the top view in FIG. 10.

A pixel portion 704 is placed in the center of an active matrix substrate 701. A source signal line driver circuit 702 for driving source signal lines is positioned above the pixel portion 704. Gate signal line driver circuits 703 for driving gate signal lines are placed in the left and right of the pixel portion 704. Although the gate signal line driver circuits 703 are symmetrical with respect to the pixel portion in this embodiment, the liquid crystal module may have only one gate signal line driver circuit on one side of the pixel portion. A designer can choose the arrangement that suits better considering the substrate size or the like of the liquid crystal module. However, the symmetrical arrangement of the gate signal line driver circuits shown in FIG. 10 is preferred in terms such as operation reliability and driving efficiency of the circuit.

Signals are inputted to the driver circuits from flexible printed circuits (FPC) 705. The FPCs 705 are press-fit through an anisotropic conductive film or the like after opening contact holes in the interlayer insulating film and resin film and forming a connection electrode 309 so as to reach the wiring lines arranged in given places of the substrate 701. The connection electrode is formed of ITO in this embodiment.

A sealing agent 707 is applied along a perimeter of the substrate in the periphery of the driver circuits and the pixel portion. Then, an opposite substrate 706 is bonded to the substrate 701 while a spacer formed in advance on the active matrix substrate keeps the gap between the two substrates constant. A liquid crystal element is injected through a portion that is not coated with the sealing agent 707. The substrates are then sealed by a sealant 708. The liquid crystal module is completed through the above steps.

Although all of the driver circuits are formed on the substrate here, several ICs may be used for some of the driver circuits.

As described above, an active matrix liquid crystal module having high reliability, good electrical characteristics and light in weight can be manufactured.

[Embodiment 6]

An active matrix substrate, a liquid crystal module and an EL module using the active matrix substrate, which are shown in Embodiments 1 to 5, can be applied to the display portions of various electronic apparatuses.

Such electronic apparatuses can be given as a video camera, a digital camera, a projector, a head-mounted display (goggle type display), a car navigation system, a car stereo, a personal computer, a mobile information terminal (such as a mobile computer, a mobile telephone or an electronic book etc.) or the like. Practical examples thereof are shown in FIGS. 12 and 13.

Figure 12A:
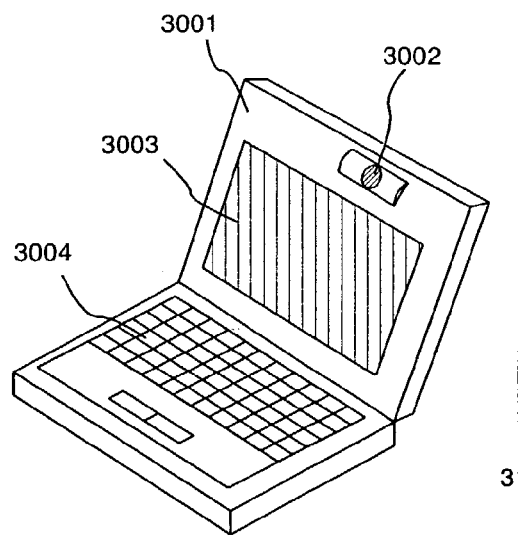
FIGS. 12A to 12F are diagrams showing electronic devices to which Embodiment 6 of the present invention is applied.

FIG. 12A shows a personal computer which includes a main body 3001, an image input portion 3002, a display portion 3003, a keyboard 3004 and the like. A compact and lightweight personal computer can be completed by implementing the present invention.

Figure 12B:
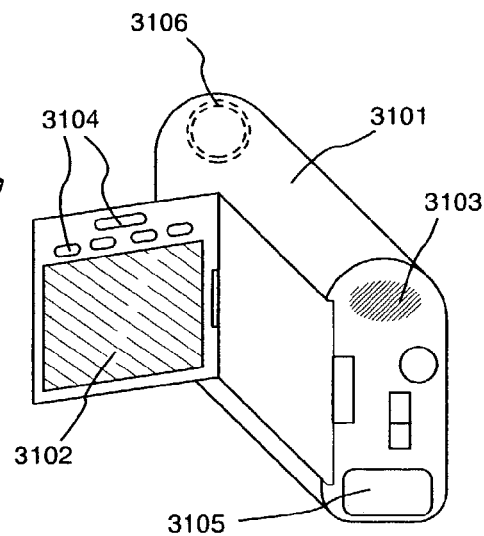

FIG. 12B shows a video camera which includes a main body 3101, a display portion 3102, a sound input portion 3103, operating switches 3104, a battery 3105, an image receiving portion 3106 and the like. A compact and lightweight video camera can be completed by implementing the present invention.

Figure 12C:
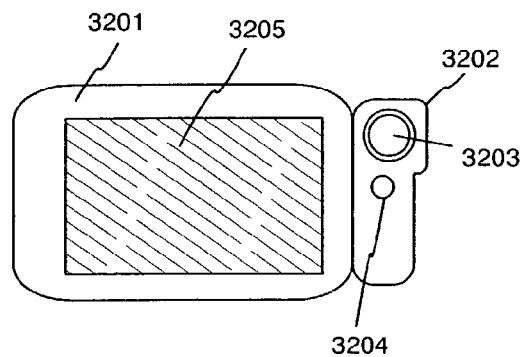

FIG. 12C shows a mobile computer which includes a main body 3201, a camera portion 3202, an image receiving portion 3203, an operating switch 3204, a display portion 3205 and the like. A compact and lightweight mobile computer can be completed by implementing the present invention.

Figure 12D:
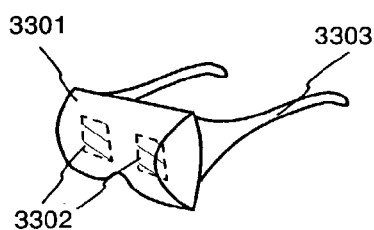

FIG. 12D shows a goggle type display which includes a main body 3301, a display portion 3302, arm portions 3303 and the like. A compact and lightweight goggle type display can be completed by implementing the present invention.

Figure 12E:
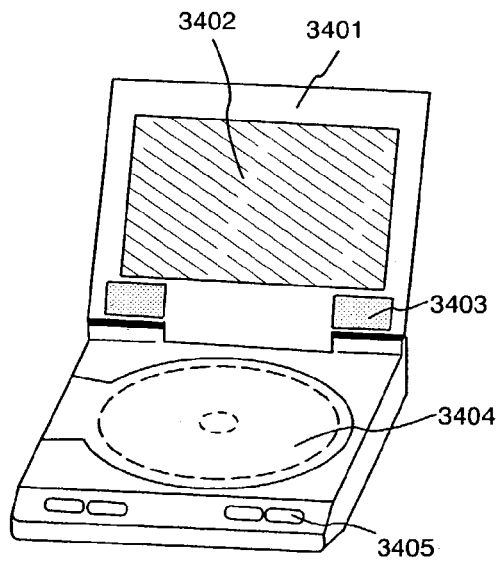

FIG. 12E shows a player using a recording medium on which a program is recorded (hereinafter referred to as the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. A compact and lightweight recording medium can be completed by implementing the present invention.

Figure 12F:
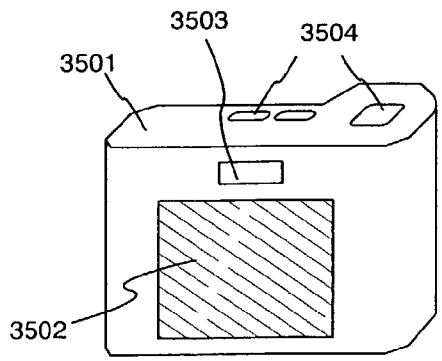

FIG. 12F shows a digital camera which includes a body 3501, a display portion 3502, an eyepiece portion 3503, operating switches 3504, an image receiving portion (not shown) and the like. A compact and lightweight digital camera can be completed by implementing the present invention.

Figure 13A:
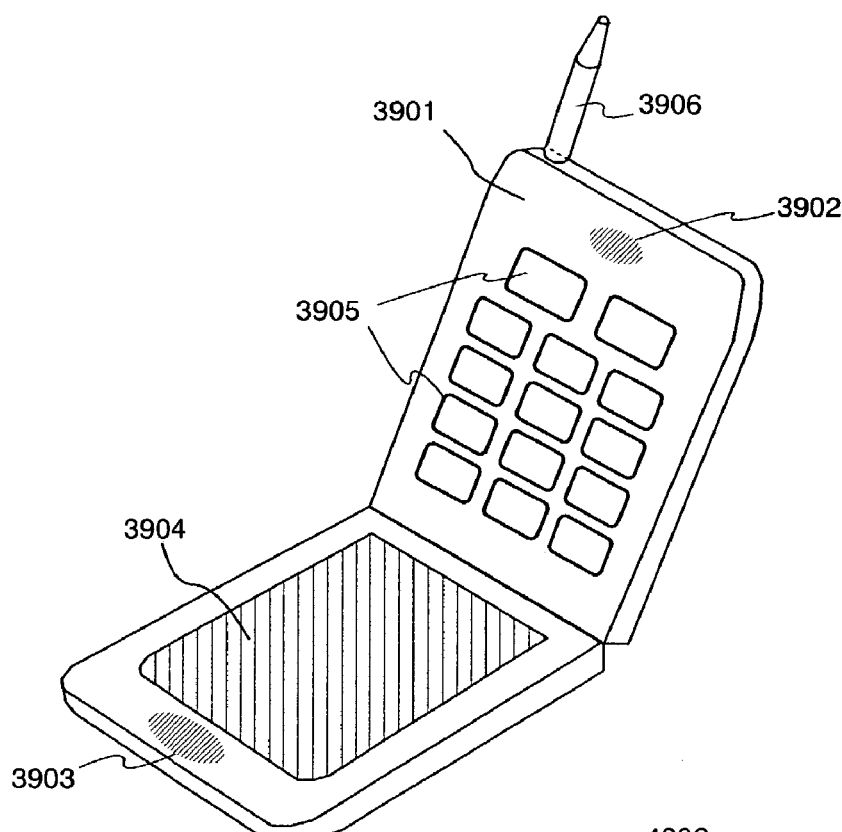
FIGS. 13A to 13C are diagrams showing electronic devices to which Embodiment 6 of the present invention is applied.

FIG. 13A shows a mobile telephone which includes a main body 3901, a sound output portion 3902, a sound input portion 3903, a display portion 3904, operating switches 3905, an antenna 3906 and the like. A compact and lightweight mobile telephone can be completed by implementing the present invention.

Figure 13B:
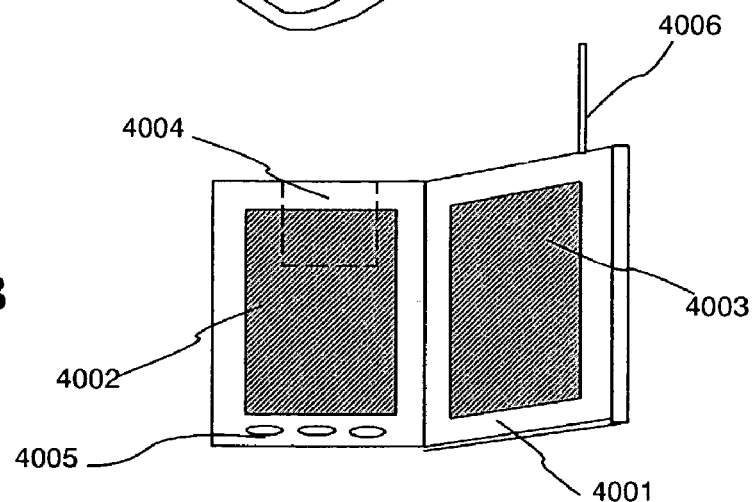

FIG. 13B shows a mobile book (electronic book) which includes a main body 4001, display portions 4002 and 4003, a storage medium 4004, operating switches 4005, an antenna 4006 and the like. A compact and lightweight mobile book can be completed by implementing the present invention.

Figure 13C:
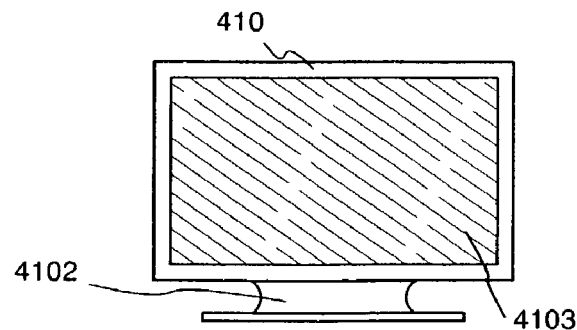

FIG. 13C shows a display which includes a main body 4101, a support base 4102, a display portion 4103 and the like. A compact and lightweight display of the present invention can be completed by implementing the present invention.

As is apparent from the foregoing description, the range of applications of the invention is extremely wide, and the invention can be applied to any category of electronic apparatuses having semiconductor devices therein.

Effects as shown below can be obtained by implementing the structure of the present invention.

The object to be peeled of the laminate can be transferred from the substrate onto a transferring member, in particular onto a plastic substrate.

Further, an object to be peeled having semiconductor elements (such as thin film transistors, organic thin film transistors, thin film diodes, photoelectric conversion elements, and resistive elements) can be transferred onto a transferring member, in particular onto a plastic substrate, in a short time.

Further, it is possible to measure the characteristics of various semiconductor elements, typically thin film transistors, after peeling an object to be peeled from a substrate and transferring it onto a plastic substrate.

In addition, after transferring an object to be peeled onto a plastic substrate, a support formed on the object to be peeled is peeled away, and therefore the thickness of a device having the object to be peeled becomes smaller, and miniaturization of the overall device can be achieved. The transmittivity of light emitted from light emitting elements or a backlight can be increased if the device is a downward emission light emitting device or a transmissive liquid crystal display device.

In addition, it is possible to peel an object to be peeled from a substrate without damaging a support, and the support can be reused. A large reduction in cost can therefore be achieved if an expensive material like quartz glass, or a rare material is used for the support.

What is claimed is:

1. A method of transferring a laminate comprising:
   forming an object over a first substrate with a peeling layer interposed therebetween;
   bonding a support to the object with a peelable adhesive medium interposed therebetween, wherein the peelable adhesive medium includes a first adhesive and a second adhesive with a second substrate interposed therebetween;
   peeling the object from the first substrate at the peeling layer;
   bonding the object to a first transferring member; and
   peeling the support and the peelable adhesive medium from the object.

2. A method of transferring a laminate comprising:
   forming an object over a first substrate with a peeling layer interposed therebetween;
   bonding a support to the object with a peelable adhesive medium interposed therebetween, wherein the peelable adhesive medium includes a first adhesive and a second adhesive with a second substrate interposed therebetween;
   peeling the object from the first substrate at the peeling layer;
   bonding one side of the object to a first transferring member;
   peeling the support and the peelable adhesive medium from the object; and bonding the other side of the object to a second transferring member.

3. A method of transferring a laminate comprising:
   forming an object over a first substrate with a peeling layer interposed therebetween;
   bonding a support to the object with a peelable adhesive medium interposed therebetween, wherein the peelable adhesive medium includes a first adhesive and a second adhesive with a second substrate interposed therebetween;
   peeling the object from the first substrate at the peeling layer by physical means;
   bonding the object to a first transferring member; and
   peeling the support and the peelable adhesive medium from the object.

4. A method of transferring a laminate comprising:
   forming an object over a first substrate with a peeling layer interposed therebetween;
   bonding a support to the object with a peelable adhesive medium interposed therebetween, wherein the peelable adhesive medium includes a first adhesive and a second adhesive with a second substrate interposed therebetween;
   peeling the object from the first substrate at the peeling layer by physical means;
   bonding one side of the object to a first transferring member; and
   peeling the support and the peelable adhesive medium from the object; and
   bonding the other side of the object to a second transferring member.

5. A method of transferring a laminate according to any one of claims 1 to 4, wherein the object has an oxide layer comprising at least one selected from silicon oxide or metal oxide, and the oxide layer is in contact with the peeling layer.

6. A method of transferring a laminate according to any one of claims 1 to 4, wherein the peeling layer comprises a metal film containing at least one element selected from titanium, aluminum, tantalum, tungsten, molybdenum, copper, chromium, neodymium, iron, nickel, cobalt, ruthenium, rhodium, palladium, osmium, and iridium.

7. A method of transferring a laminate according to any one of claims 1 to 4, wherein the peeling layer comprises a nitride film containing at least one element selected from titanium, aluminum, tantalum, tungsten, molybdenum, copper, chromium, neodymium, iron, nickel, cobalt, ruthenium, rhodium, palladium, osmium, and iridium.

8. A method of transferring a laminate according to any one of claims 1 to 4, wherein the first transferring member comprises a plastic.

9. A method of transferring a laminate according to any one of claims 2 and 4, wherein the second transferring member comprises a plastic.

10. A method of transferring a laminate according to any one of claims 1 to 4, wherein the peelable adhesive medium comprises a two-sided tape.

11. A method of manufacturing a semiconductor device comprising:
    forming an object comprising a semiconductor element over a first substrate with a peeling layer interposed therebetween;
    bonding a support to the object with a peelable adhesive medium interposed therebetween, wherein the peelable adhesive medium includes a first adhesive and a second adhesive with a second substrate interposed therebetween;
    peeling the object from the first substrate at the peeling layer;
    bonding the object to a first transferring member; and
    peeling the support and the peelable adhesive medium from the object.

12. A method of manufacturing a semiconductor device comprising:
    forming an object comprising a semiconductor element over a first substrate with a peeling layer interposed therebetween;
    bonding a support to the object with a peelable adhesive medium interposed therebetween, wherein the peelable adhesive medium includes a first adhesive and a second adhesive with a second substrate interposed therebetween;
    peeling the object from the first substrate at the peeling layer;
    bonding one side of the object to a first transferring member; and
    peeling the support and the peelable adhesive medium from the object; and
    bonding the other side of the object to a second transferring member.

13. A method of manufacturing a semiconductor device comprising:
- forming an object comprising a semiconductor element over a first substrate with a peeling layer interposed therebetween;
- bonding a support to the object with a peelable adhesive medium interposed therebetween, wherein the peelable adhesive medium includes a first adhesive and a second adhesive with a second substrate interposed therebetween;
- peeling the object from the first substrate at the peeling layer by physical means;
- bonding the object to a first transferring member; and
- peeling the support and the peelable adhesive medium from the object.

14. A method of manufacturing a semiconductor device comprising:
- forming an object comprising a semiconductor element over a first substrate with a peeling layer interposed therebetween;
- bonding a support to the object with a peelable adhesive medium interposed therebetween, wherein the peelable adhesive medium includes a first adhesive and a second adhesive with a second substrate interposed therebetween;
- peeling the object from the first substrate at the peeling layer by physical means;
- bonding one side of the object to a first transferring member;
- peeling the support and the peelable adhesive medium from the object; and
- bonding the other side of the object to a second transferring member.

15. A method of manufacturing a semiconductor device according to any one of claims 11 to 14, wherein the semiconductor element comprises at least one selected from a thin film transistor, an organic thin film transistor, a thin film diode, a photoelectric conversion element, and a resistive element.

16. A method of manufacturing a semiconductor device according to any one of claims 11 to 14, wherein the object has an oxide layer comprising at least one selected from silicon oxide or metal oxide, and the oxide layer is in contact with the peeling layer.

17. A method of manufacturing a semiconductor device according to any one of claims 11 to 14, wherein the peeling layer comprises a metal film containing at least one element selected from titanium, aluminum, tantalum, tungsten, molybdenum, copper, chromium, neodymium, iron, nickel, cobalt, ruthenium, rhodium, palladium, osmium, and iridium.

18. A method of manufacturing a semiconductor device according to any one of claims 11 to 14, wherein the peeling layer comprises a nitride film containing at least one element selected from titanium, aluminum, tantalum, tungsten, molybdenum, copper, chromium, neodymium, iron, nickel, cobalt, ruthenium, rhodium, palladium, osmium, and iridium.

19. A method of manufacturing a semiconductor device according to any one of claims 11 to 14, wherein the first transferring member comprises a plastic.

20. A method of manufacturing a semiconductor device according to any one of claims 12 and 14, wherein the second transferring member comprises a plastic.

21. A method of manufacturing a semiconductor device according to any one of claims 11 to 14, wherein the peelable adhesive medium comprises a two-sided tape.

22. A method of manufacturing a semiconductor device according to any one of claims 11 to 14, wherein the semiconductor device is incorporated into at least one selected from the group consisting of a personal computer, a video camera, a mobile computer, a goggle-type display, a player using a recording medium, a digital camera, a mobile telephone, and an electronic book.

23. A method of transferring a laminate according to any one of claims 3 and 4, wherein the physical means comprises at least one selected from the group consisting of a human hand, a wind pressure of a gas sprayed from a nozzle, and an ultrasound.

24. A method of transferring a laminate according to any one of claims 1 to 4, wherein the step of peeling the support and the peelable adhesive medium from the object is conducted by first peeling the support from the peelable adhesive medium, and then peeling the peelable adhesive medium from the object.

25. A method of transferring a laminate according to any one of claims 1 to 4, wherein the first adhesive includes a heat-peeling adhesive, and the second adhesive includes an ultraviolet-peeling adhesive.

26. A method of manufacturing a semiconductor device according to any one of claims 13 and 14, wherein the physical means comprises at least one selected from the group consisting of a human hand, a wind pressure of a gas sprayed from a nozzle, and an ultrasound.

27. A method of manufacturing a semiconductor device according to any one of claims 11 to 14, wherein the step of peeling the support and the peelable adhesive medium from the object is conducted by first peeling the support from the peelable adhesive medium, and then peeling the peelable adhesive medium from the object.

28. A method of manufacturing a semiconductor device according to any one of claims 11 to 14, wherein the first adhesive includes a heat-peeling adhesive, and the second adhesive includes an ultraviolet-peeling adhesive.

* * * * *